(12) United States Patent
Miura

(10) Patent No.: US 11,118,264 B2
(45) Date of Patent: Sep. 14, 2021

(54) PLASMA PROCESSING METHOD AND PLASMA PROCESSING APPARATUS

(71) Applicant: Tokyo Electron Limited, Tokyo (JP)

(72) Inventor: Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 568 days.

(21) Appl. No.: 15/344,674

(22) Filed: Nov. 7, 2016

(65) Prior Publication Data

US 2017/0130333 A1    May 11, 2017

(30) Foreign Application Priority Data

Nov. 11, 2015   (JP) .............................. JP2015-221012

(51) Int. Cl.
  *C23C 16/455*   (2006.01)
  *C23C 16/50*    (2006.01)
  *C23C 16/52*    (2006.01)

(52) U.S. Cl.
  CPC .. *C23C 16/45544* (2013.01); *C23C 16/45502* (2013.01); *C23C 16/45534* (2013.01); *C23C 16/45551* (2013.01); *C23C 16/45563* (2013.01); *C23C 16/45578* (2013.01); *C23C 16/50* (2013.01); *C23C 16/52* (2013.01)

(58) Field of Classification Search
  CPC ........ C23C 16/45525; C23C 16/45527; C23C 16/45534; C23C 16/45536; C23C 16/45538; C23C 16/45554; C23C 16/45542; C23C 16/45528; C23C 16/45551; C23C 16/45578; C23C 16/52; C23C 16/50; C23C 16/45502; C23C 16/45544; C23C 16/45563
See application file for complete search history.

(56) References Cited

U.S. PATENT DOCUMENTS

| | | | |
|---|---|---|---|
| 2009/0134120 A1 | 5/2009 | Ohmi et al. | |
| 2009/0275210 A1* | 11/2009 | Shanker | C23C 16/04 438/761 |
| 2011/0039026 A1* | 2/2011 | Kato | C23C 16/402 427/255.26 |
| 2013/0059415 A1* | 3/2013 | Kato | C23C 16/345 438/106 |
| 2013/0087097 A1* | 4/2013 | Kato | H01J 37/321 118/663 |

FOREIGN PATENT DOCUMENTS

| | | |
|---|---|---|
| JP | 2013-045903 | 3/2013 |
| JP | 2013-135154 | 7/2013 |
| JP | 2014-060309 | 4/2014 |
| WO | 2007/034559 | 3/2007 |

* cited by examiner

*Primary Examiner* — Dah-Wei D. Yuan
*Assistant Examiner* — Nga Leung V Law
(74) *Attorney, Agent, or Firm* — IPUSA, PLLC

(57) ABSTRACT

A plasma processing method is provided. In the plasma processing method, a plurality of types of mixed gases is supplied to a plurality of areas on a film deposited on a surface of a substrate. The plurality of types of mixed gases contains a plurality types of noble gases. The plurality of types of mixed gases has different mix proportions of the plurality types of noble gases from each other. The plurality of types of mixed gases is converted to plasma. A plasma process is performed by using the mixed gases converted to the plasma on the film.

12 Claims, 16 Drawing Sheets

FIG.15A
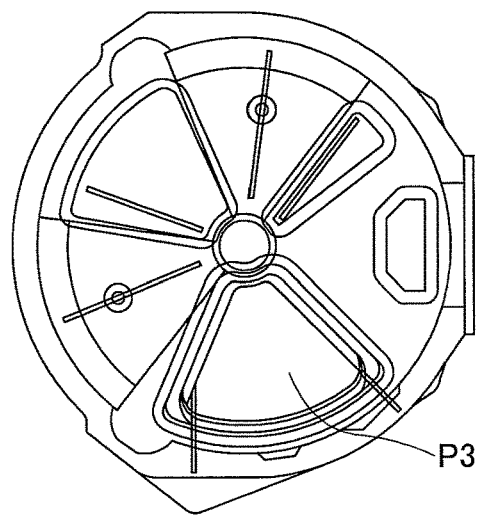
FIG.15B
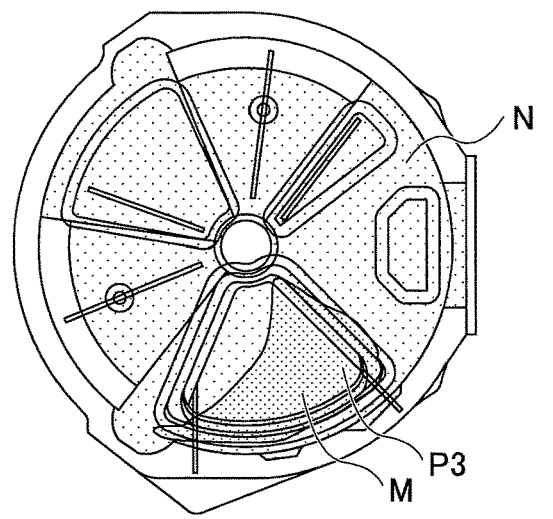
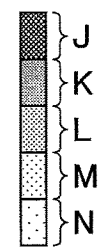
FIG.15C
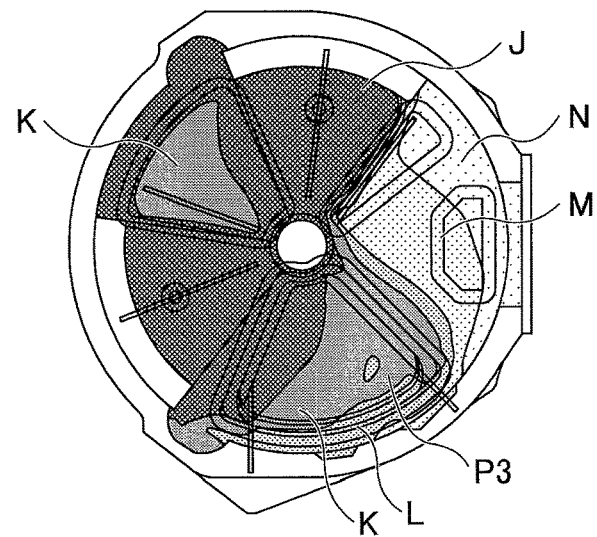
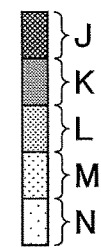

PLASMA PROCESSING METHOD AND PLASMA PROCESSING APPARATUS

CROSS-REFERENCE TO RELATED APPLICATION

The present application is based upon and claims the benefit of priority of Japanese Patent Application No. 2015-221012, filed on Nov. 11, 2015, the entire contents of which are incorporated herein by reference.

BACKGROUND OF THE INVENTION

1. Field of the Invention

The present invention relates to a plasma processing method and plasma processing apparatus.

2. Description of the Related Art

ALD (Atomic Layer Deposition) and MLD (Molecular Layer Deposition) in which a plurality kinds of process gases (reaction gases) that react with each other is sequentially supplied to a surface of a substrate such as a semiconductor wafer are known as one of methods for depositing a thin film such as a silicon oxide film ($SiO_2$) on the surface of the wafer. For example, Japanese Laid-Open Patent Application Publication No. 2013-45903 discloses a turntable type film deposition apparatus combined with a plasma source as one of the ALD film deposition apparatuses. More specifically, the turntable type film deposition apparatus includes a turntable on which five or six wafers are arranged along a circumferential direction thereof, and an antenna to convert a gas into plasma arranged so as to face a path of the wafer that moves by rotation of the turntable.

For example, a high-quality and high-speed ALD film deposition can be performed by using such an apparatus. For example, the high-quality $SiO_2$ film deposition methods include a method of depositing a high-quality $SiO_2$ film on a wafer by supplying a Si-containing gas such as 3DMAS gas (tris(dimethyleamino)silane) and an organic aminosilane gas into a source gas supply area, an oxidation gas such as $O_3$ into a reaction gas supply area, and a mixed gas of argon, hydrogen and oxygen into a plasma processing area, respectively, and causing the wafer to pass through these areas at high speed. In this method, one layer of the Si source adsorbed on the wafer in the source gas supply area is oxidized in the reaction gas supply area, and then modified in the plasma processing area where a density of plasma and an effect of plasma modification are kept high. Furthermore, the Si adsorption is continuously performed again in the source gas supply area, and the film uniformity across the surface of the wafer can be readily achieved.

However, along with miniaturization of circuit patterns, for example, as aspect ratios of trenches in trench and device isolation structures and spaces in line and space patterns increase, filling the trenches and the spaces with a film is sometimes difficult even in MLD. For example, when a space with a width of about 30 nm is tried to be filled with a silicon oxide film, because a reaction gas is difficult to go into a bottom portion of the narrow space, the film thickness on and around the top end of a side wall of a line defining the space is likely to be thick, and the film thickness on and around the bottom portion is likely to be thin. Thus, a void is generated in the silicon oxide film filled in the space. When such a silicon oxide film is etched in the following etching process, for example, an opening in communication with the void may be formed in the upper surface of the silicon oxide film. On this occasion, an etching gas (or an etching solution) is liable to go into the opening, thereby causing contamination, and a metal is liable to go into the void in the following metallization, thereby generating a defect.

Such a problem can occur in not only ALD but also CVD (Chemical Vapor Deposition). For example, when a conductive contact hole (so-called plug) is formed by filling a contact hole formed in a semiconductor substrate with a film made of a conductive material, a void is sometimes formed in the plug. Therefore, to prevent this, Japanese Laid-Open Patent Application Publication No. 2013-135154 describes a film deposition method in which an organic aminosilane gas is caused to adsorb on a surface in a trench; an adsorption site is formed by adsorption of an OH group; and an upper portion of the trench is oxidized by oxidation plasma, thereby leaving many OH groups on and around the bottom and few OH groups at and around the opening portion. When a silicon oxide film is deposited in such a state, the silicon oxide film is deposited so as to becomes thick on and around the bottom and to become thin with the decreasing distance to the opening portion (upper end) with high bottom-up properties, thereby preventing the generation of the void.

However, the film deposition method as described in Japanese Laid-Open Patent Application Publication No. 2013-135154 in which the distribution of OH groups is controlled by plasma and thereby controlling an amount of adsorption of the organic aminosilane gas is often more difficult to acquire preferable uniformity across the substrate than the film deposition method of causing one layer of a source gas on a substrate, oxidizing the one layer of the source gas, and modifying the one oxidized layer. When a turntable type substrate processing apparatus or plasma processing apparatus is used, in the control of the distribution of OH groups by the plasma source, oxidation is likely to be insufficient at the periphery and many OH groups are likely to be present at the periphery because the peripheral portion rotates and moves faster than the central portion around the axis due to a difference in angular velocity. Thus, the amount of adsorption of the organic aminosilane at the periphery is likely to be more than that of the central portion, and the film thickness at the periphery is sometimes thicker than that of the central portion.

Moreover, in other types of substrate processes and plasma processes that do not control the OH groups, with respect to the turntable type plasma processing apparatus, a supply of plasma at the periphery is likely to be lower than the supply at the central portion due to the above-mentioned difference in angular velocity, and a disproportion of the plasma process between the central portion and the peripheral portion of the turntable is liable to be generated.

Furthermore, when the turntable type plasma processing apparatus is not used, a regional distribution of the plasma process is sometimes desired to be adjusted.

SUMMARY OF THE INVENTION

Embodiments of the present invention provide a plasma processing method and plasma processing apparatus solving one or more of the problems discussed above.

More specifically, the embodiments of the present invention may provide a plasma processing method and plasma processing apparatus that can achieve high plasma controllability, preferable uniformity of the film thickness across a surface of a substrate, uniformity of coverage performance across the surface of the substrate and uniformity of film quality across the surface of the substrate.

According to an embodiment of the present invention, there is provided a plasma processing method. In the plasma processing method, a plurality of types of mixed gases is supplied to a plurality of areas on a film deposited on a surface of a substrate. The plurality of types of mixed gases contains a plurality types of noble gases. The plurality of types of mixed gases has different mix proportions of the plurality types of noble gases from each other. The plurality of types of mixed gases is converted to plasma. A plasma process is performed by using the mixed gases converted to the plasma on the film.

According to another embodiment of the present invention, there is provided a plasma processing apparatus. The plasma processing apparatus includes a process chamber to contain a substrate therein and to perform a plasma process on the substrate. A turntable is provided in the process chamber to receive the substrate thereon along a rotational direction thereof. A plasma processing area is provided in a predetermined area along the rotational direction of the turntable and above the turntable, the plasma processing area being surrounded by a ceiling surface and a side surface. A plurality of gas nozzles is provided to supply a plurality of types of mixed gases containing different types of noble gases and/or different mixing ratios to a plurality of areas in the plasma processing areas, respectively. A flow controller is provided to adjust and supply the plurality of types of mixed gases to each of the plurality of gas nozzles. A plasma generator is provided to convert each of the plurality of types of mixed gases to plasma.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 15A is a diagram for illustrating a positional relationship of a plasma processing apparatus in a first simulation according to an embodiment of the present invention;

FIG. 15B is a diagram showing a concentration distribution of He gas of an area under an opening of a plasma processing area in the first simulation;

FIG. 15C is a diagram showing a concentration distribution of Ar gas above a turntable in the first simulation;

DESCRIPTION OF THE PREFERRED EMBODIMENTS

Embodiments of the present invention are described below with reference to the accompanying drawings.

[Configuration of Plasma Processing Apparatus]

Figure 1:
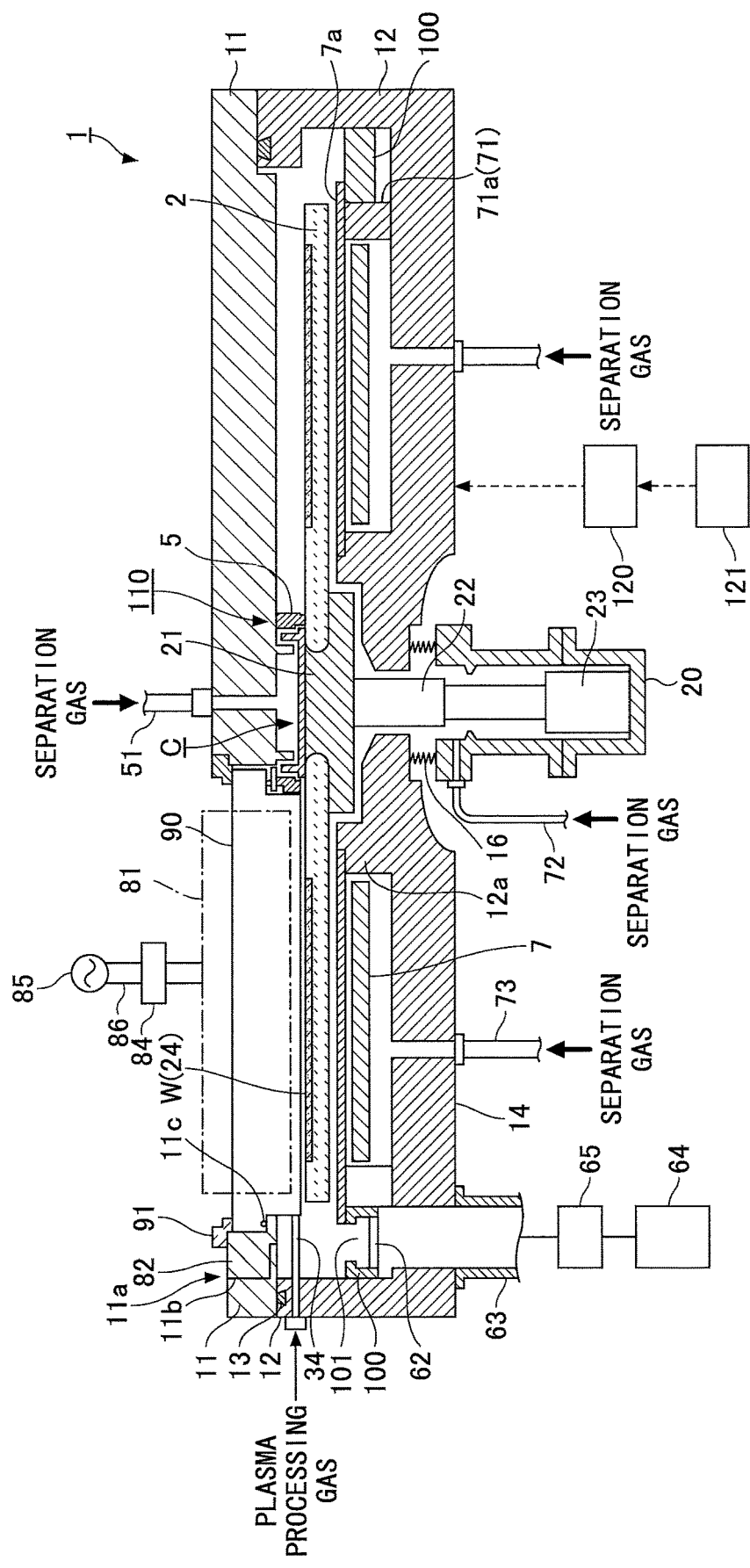
FIG. 1 is a schematic vertical cross-sectional view illustrating a plasma processing apparatus of an example according to an embodiment of the present invention.
Figure 2:
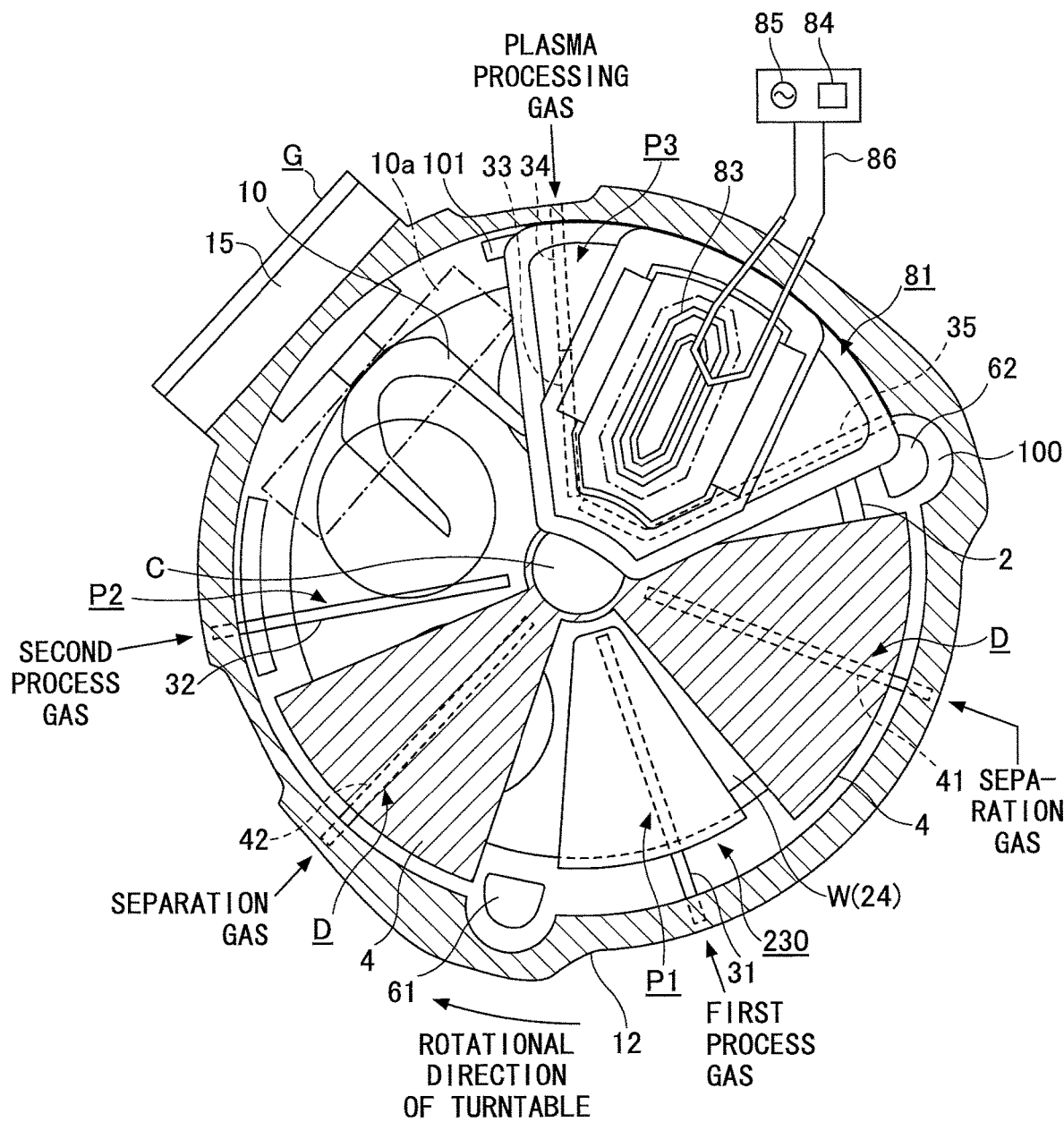
FIG. 2 is a schematic plan view illustrating a plasma processing apparatus of an example according to an embodiment of the present invention.

FIG. 1 is a schematic vertical cross-sectional view illustrating an example of a plasma processing apparatus according to an embodiment of the present invention. FIG. 2 is a schematic plan view illustrating an example of the plasma processing apparatus according to the embodiment. In FIG. 2, for convenience of explanation, a depiction of a top plate 11 is omitted.

As illustrated in FIG. 1, the plasma processing apparatus of the embodiment includes a vacuum chamber 1 having a substantially circular planar shape, and a turntable 2 that is disposed in the vacuum chamber 1 such that the rotational center of the turntable 2 coincides with the center of the vacuum chamber 1. The turntable 2 rotates wafers W placed thereon by rotating around its rotational center.

The vacuum chamber 1 is a process chamber to accommodate wafers W therein and to perform a plasma process on a film or the like deposited on surfaces of the wafers W. The vacuum chamber 1 includes a top plate (ceiling) 11 that faces concave portions 24 formed in a surface of the turntable 2, and a chamber body 12. A ring-shaped seal member 13 is provided at the periphery of the upper surface of the chamber body 12. The top plate 11 is configured to be attachable to and detachable from the chamber body 12. The diameter (inside diameter) of the vacuum chamber 1 in plan view is, for example, about 1100 mm, but is not limited to this.

A separation gas supply pipe 51 is connected to the center of the upper side of the vacuum chamber 1 (or the center of the top plate 11). The separation gas supply pipe 51 supplies a separation gas to a central area C in the vacuum chamber 1 to prevent different process gases from mixing with each other in the central area C.

A central part of the turntable 2 is fixed to an approximately-cylindrical core portion 21. A rotational shaft 22 is connected to a lower surface of the core portion 21 and extends in the vertical direction. The turntable 2 is configured to be rotatable by a drive unit 23 about the vertical axis of the rotational shaft 22, in a clockwise fashion in the example of FIG. 2. The diameter of the turntable 2 is, for example, but is not limited to, about 1000 mm.

The rotational shaft 22 and the drive unit 23 are housed in a case body 20. An upper-side flange of the case body 20 is hermetically attached to the lower surface of a bottom part 14 of the vacuum chamber 1. A purge gas supply pipe 72 is connected to the case body 20. The purge gas supply pipe 72 supplies a purge gas (separation gas) such as argon gas to an area below the turntable 2.

A part of the bottom part 14 of the vacuum chamber 1 surrounding the core portion 21 forms a ring-shaped protrusion 12a that protrudes so as to approach the turntable 2 from below.

Circular concave portions 24 (or substrate receiving areas), where the wafers W having a diameter of, for example, 300 mm are placed, are formed in the upper surface of the turntable 2. A plurality of (e.g., five) concave portions 24 are provided along the rotational direction of the turntable 2. Each of the concave portions 24 has an inner diameter that is slightly (e.g., from 1 mm to 4 mm) greater than the diameter of the wafer W. The depth of the concave portion 24 is substantially the same as or greater than the thickness of the wafer W. Accordingly, when the wafer W is placed in the concave portion 24, the height of the upper surface of the wafer W becomes substantially the same as or lower than the height of the upper surface of the turntable 2 where the wafers W are not placed. When the depth of the concave portion 24 is excessively greater than the thickness of the wafer W, it may adversely affect film deposition. Therefore, the depth of the concave portion 24 is preferably less than or equal to about three times the thickness of the wafer W. Through holes (not illustrated in the drawings) are formed in the bottom of the concave portion 24 to allow a plurality of (e.g., three) lifting pins (which are described later) to pass through. The lifting pins raise and lower the wafer W.

As illustrated in FIG. 2, a first process area P1, a second process area P2 and a third process area P3 are provided apart from each other along the rotational direction of the turntable 2. Because the third process area P3 is a plasma processing area, it may be also referred to as a plasma processing area P3 hereinafter. A plurality of (e.g., seven) gas nozzles 31, 32, 33, 34, 35, 41, and 42 made of, for example, quartz are arranged at intervals in a circumferential direction of the vacuum chamber 1. The gas nozzles 31 through 35, 41, and 42 extend radially, and are disposed to face areas that the concave portions 24 of the turntable 2 pass through. The nozzles 31 through 35, 41, and 42 are placed between the turntable 2 and the top plate 11. Here, each of the gas nozzles 31 through 35, 41, and 42 extends horizontally from the outer wall of the vacuum chamber 1 toward the central area C so as to face the wafers W. On the other hand, the gas nozzle 35 extends from the outer wall of the vacuum chamber 1 toward the central area C, and then bends and extends linearly along the central area C in a counterclockwise fashion (opposite direction of the rotational direction of the turntable 2). In the example of FIG. 2, plasma processing gas nozzles 33 and 34, a plasma processing gas nozzle 35, a separation gas nozzle 41, a first process gas nozzle 31, a separation gas nozzle 42 and a second process gas nozzle 32 are arranged in a clockwise fashion (the rotational direction of the turntable 2) from a transfer opening 15 in this order. Here, a gas supplied from the second process gas nozzle 32 is often similar to a gas supplied from the plasma processing gas nozzles 33 through 35, but the second process gas nozzle 32 may not be necessarily provided when the plasma processing, gas nozzles 33 through 35 sufficiently supply the gas.

Thus, in the present embodiment, a plurality of nozzles is provided in the plasma processing area P3. For example, as illustrated in FIG. 2, three of the plasma processing gas nozzles 33 through 35 are arranged in the plasma processing area P3, and each of the plasma processing gas nozzles 33 through 35 is configured to be able to supply a mixed gas of argon gas and/or helium gas and an oxidation gas at a different flow rate (mixing ratio, or mix proportions) from each other.

The first process gas nozzle 31 forms a "first process gas supply part". Each of the plasma processing gas nozzles 33, 34 and 35 forms a "plasma processing gas supply part". Each of the separation gas nozzles 41 and 42 forms a "separation gas supply part".

Each of the gas nozzles 31 through 35, 41, and 42 is connected to gas supply sources (not illustrated in the drawings) via a flow control valve.

Gas discharge holes 36 for discharging a gas are formed in the lower side (which faces the turntable 2) of each of the nozzles 31 through 35, 41, and 42. The gas discharge holes 36 are formed, for example, at regular intervals along the radial direction of the turntable 2. The distance between the lower end of each of the nozzles 31 through 35, 41, and 42 and the upper surface of the turntable 2 is, for example, from about 1 mm to about 5 mm.

An area below the first process gas nozzle 31 is a first process area P1 where a first process gas is adsorbed on the wafer W. An area below the second process gas nozzle 32 is a second process area P2 where a second process gas that can produce a reaction product by reacting with the first process gas is supplied to the wafer W. An area below the plasma processing gas nozzles 33 through 35 is a third process area P3 where a modification process is performed on a film on the wafer W. The separation gas nozzles 41 and 42 are provided to form separation areas D for separating the first process area P1 from the second process area P2, and separating the third process area P3 from the first process area P1, respectively. Here, the separation area D is not provided between the second process area P2 and the third process area P3. This is because the second process gas supplied in the second process area P2 and the mixed gas supplied in the third process area P3 partially contain a common component therein in many cases, and therefore the second process area P2 and the third process area P3 do not have to be separated from each other by particularly using the separation gas.

Although described in detail later, the first process gas nozzle 31 supplies a source gas that forms a principal component of a film to be deposited. For example, when the film to be deposited is a silicon oxide film ($SiO_2$), the first process gas nozzle 31 supplies a silicon-containing gas such as an organic aminosilane gas. The second process gas nozzle 32 supplies an oxidation gas such as oxygen gas and ozone gas. The plasma processing gas nozzles 33 through 35 supply a mixed gas containing the same gas as the second process gas and a noble gas to perform a modification process on the deposited film. For example, when the film to be deposited is the silicon oxide film ($SiO_2$), the plasma processing gas nozzles 33 through 35 supply a mixed gas of the oxidation gas such as oxygen gas and ozone gas same as the second process gas and a noble gas such as argon and helium. Here, because the plasma processing gas nozzles 33 through 35 are structured to supply the gas to different areas on the turntable 2, the flow rate of the noble gas is changed for each area so as to uniformly perform the modification process as a whole. More specifically, because a modification effect of helium is higher than that of argon, helium is supplied more than argon to an area where the modification effect is likely to be low. A detail of a specific method for supplying the mixed gas is described later.

Figure 3:
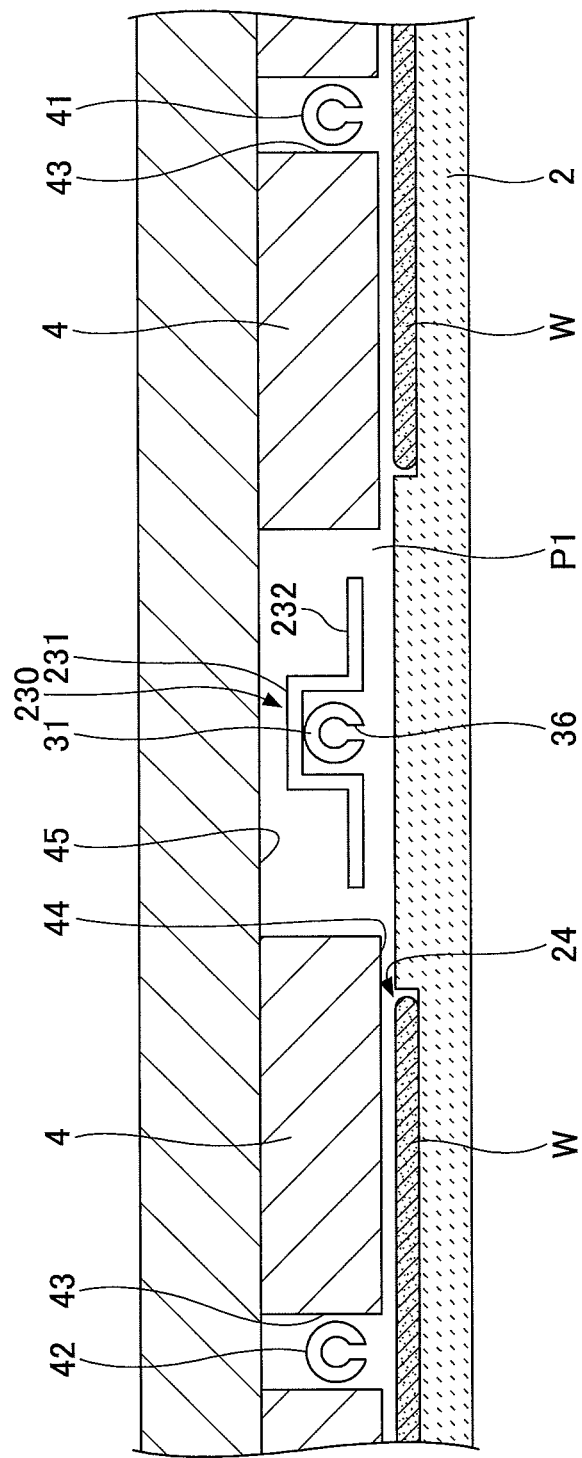
FIG. 3 is a cross-sectional view of a part of a plasma processing apparatus taken along a concentric circle of a turntable.

FIG. 3 illustrates a cross section of a part of the substrate processing apparatus taken along a concentric circle of the turntable 2. More specifically, FIG. 3 illustrates a cross section of a part of the substrate processing apparatus from one of the separation areas D through the first process area P1 to the other one of the separation areas D.

Approximately fan-like convex portions 4 are provided on the lower surface of the top plate 11 of the vacuum chamber 1 at locations corresponding to the separation areas D. The convex portions 4 are attached to the back surface of the top plate 11. In the vacuum chamber 1, flat and low ceiling surfaces 44 (first ceiling surfaces) are formed by the lower surfaces of the convex portions 4, and ceiling surfaces 45 (second ceiling surfaces) are formed by the lower surface of the top plate 11. The ceiling surfaces 45 are located on both sides of the ceiling surfaces 44 in the circumferential direction, and are located higher than the ceiling surfaces 44.

As illustrated in FIG. 2, each of the convex portions 4 forming the ceiling surface 44 has a fan-like planar shape whose apex is cut off to form an arc-shaped side. Also, a groove 43 extending in the radial direction is formed in each of the convex portions 4 at the center in the circumferential direction. Each of the separation gas nozzles 41 and 42 is placed in the groove 43. A peripheral part of the convex portion 4 (a part along the outer edge of the vacuum chamber 1) is bent to form an L-shape to prevent the process gases from mixing with each other. The L-shaped part of the convex portion 4 faces the outer end surface of the turntable 2 and is slightly apart from the chamber body 12.

A nozzle cover 230 is provided above the first process gas nozzle 31. The nozzle cover 230 causes the first process gas to flow along the wafer W, and causes the separation gas to flow near the top plate 11 instead of near the wafer W. As illustrated in FIG. 3, the nozzle cover 230 includes an approximately-box-shaped cover 231 having an opening in the lower side to accommodate the first process gas nozzle 31, and current plates 232 connected to the upstream and downstream edges of the opening of the cover body 231 in the rotational direction of the turntable 2. A side wall of the cover body 231 near the rotational center of the turntable 2 extends toward the turntable 2 to face a tip of the first process gas nozzle 31. Another side wall of the cover 231 near the outer edge of the turntable 2 is partially cut off so as not to interfere with the first process gas nozzle 31.

As illustrated in FIG. 2, a plasma generator 81 is provided above the plasma processing gas nozzles 33 through 35 to convert a plasma processing gas discharged into the vacuum chamber 1 to plasma.

Figure 4:
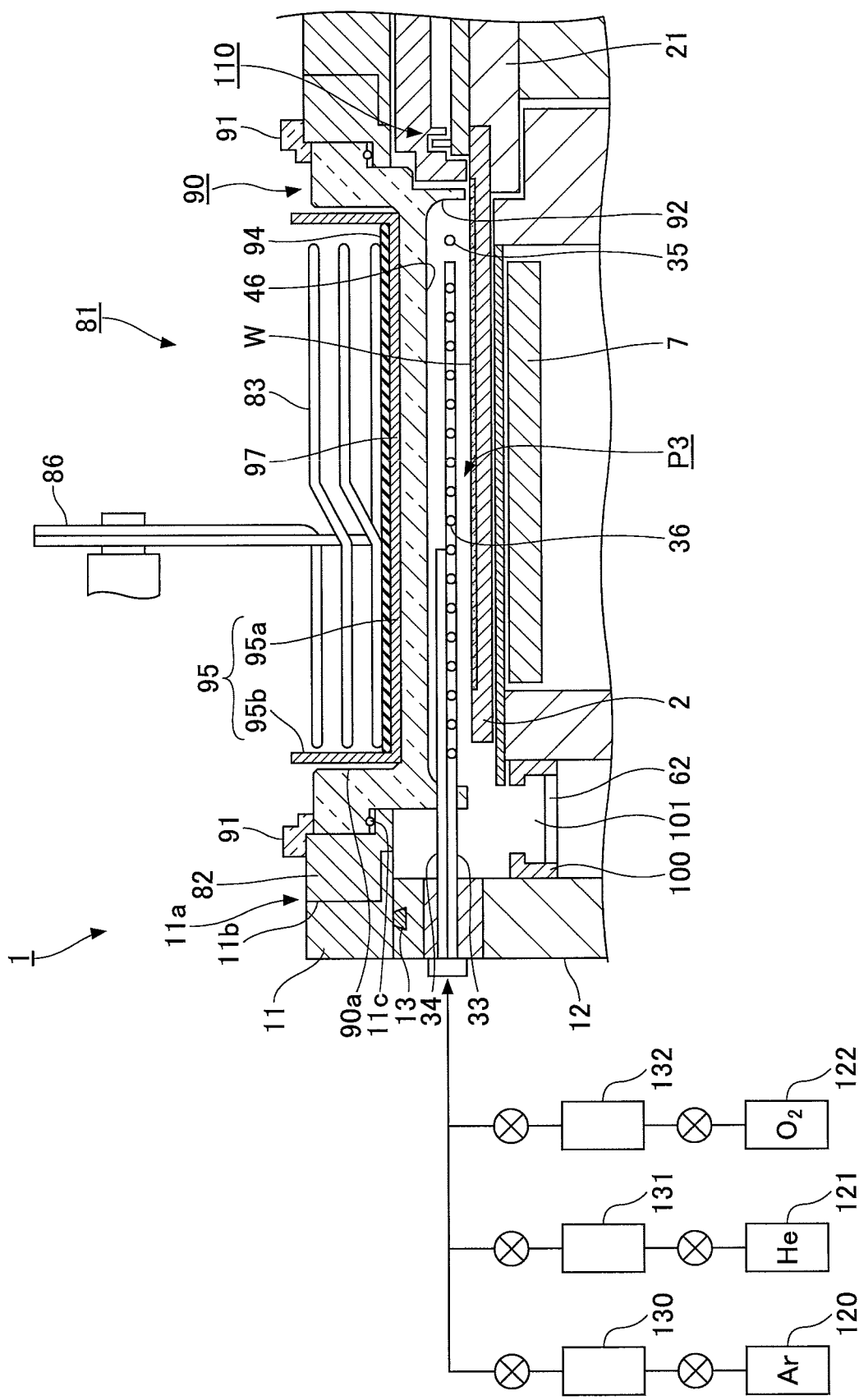
FIG. 4 is a vertical cross-sectional view of an example of a plasma generator of a plasma processing apparatus according to an embodiment of the present invention.
Figure 5:
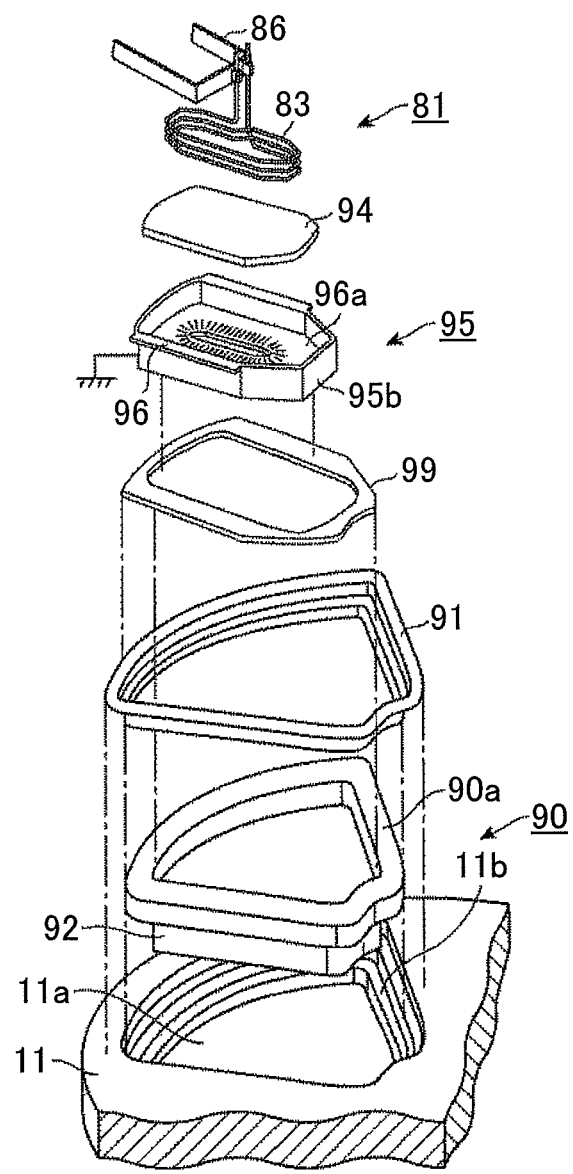
FIG. 5 is an exploded perspective view of an example of a plasma generator of a plasma processing apparatus according to an embodiment of the present invention.
Figure 6:
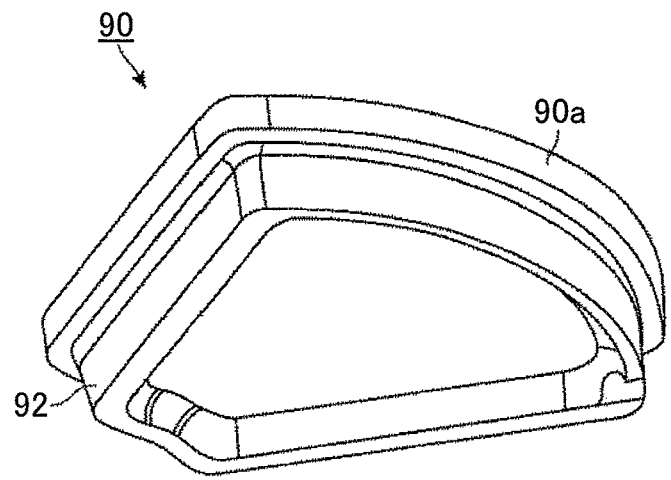
FIG. 6 is a perspective view of an example of a housing of a plasma generator of a plasma processing apparatus according to an embodiment of the present invention.

FIG. 4 is a vertical cross-sectional view of an example of the plasma generator 81. FIG. 5 is an exploded perspective view of an example of the plasma generator 81. FIG. 6 is a perspective view of an example of a housing 90 of the plasma generator 81.

The plasma generator 81 is configured by winding an antenna 83 made of a metal wire or the like, for example, three times around a vertical axis in a coil form. In plan view, the plasma generator 81 is disposed to surround a strip-shaped area extending in the radial direction of the turntable 2 and to extend across the diameter of the wafer W on the turntable 2.

The antenna 83 is connected through a matching box 84 to a high frequency power source 85 that has, for example, a frequency of 13.56 MHz and output power of 5000 W. The antenna 83 is hermetically separated from the inner area of the vacuum chamber 1. As illustrated in FIGS. 1, 2, and 4, a connection electrode 86 electrically connects the antenna 83, the matching box 84, and the high frequency power source 85.

As illustrated in FIGS. 4 and 5, an opening 11a having an approximately fan-like shape in plan view is formed in the top plate 11 above the plasma processing gas nozzles 33 through 35.

As illustrated in FIG. 4, a ring-shaped member 82 is hermetically attached to the periphery of the opening 11a. The ring-shaped member 82 extends along the periphery of the opening 11a. The housing 90 is hermetically attached to the inner circumferential surface of the ring-shaped member 82. That is, the outer circumferential surface of the ring-shaped member 82 faces an inner surface 11b of the opening 11a of the top plate 11, and the inner circumferential surface of the ring-shaped member 82 faces a flange part 90a of the housing 90. The housing 90 is placed via the ring-shaped member 82 in the opening 11a to enable the antenna 83 to be placed at a position lower than the top plate 11. The housing 90 may be made of a dielectric material such as quartz. The bottom surface of the housing 90 forms a ceiling surface 46 of the plasma processing area P3.

As illustrated in FIG. 6, an upper peripheral part surrounding the entire circumference of the housing 90 extends horizontally to form the flange part 90a. Moreover, a central part of the housing 90 in plan view is recessed toward the inner area of the vacuum chamber 1.

The housing 90 is arranged so as to extend across the diameter of the wafer W in the radial direction of the turntable 2 when the wafer W is located under the housing 90. A seal member 11c such as an O-ring is provided between the ring-shaped member 82 and the top plate 11.

The internal atmosphere of the vacuum chamber 1 is hermetically sealed by the ring-shaped member 82 and the housing 90. As illustrated in FIG. 5, the ring-shaped member 82 and the housing 90 are placed in the opening 11a, and the entire circumference of the housing 90 is pressed downward via a frame-shaped pressing member 91 that is placed on the upper surfaces of the ring-shaped member 82 and the housing 90 and extends along a contact region between the ring-shaped member 82 and the housing 90. The pressing member 91 is fixed to the top plate 11 with, for example, bolts (not illustrated in the drawing). As a result, the internal atmosphere of the vacuum chamber 1 is sealed hermetically. In FIG. 5, a depiction of the ring-shaped member 82 is omitted for simplification.

As illustrated in FIG. 6, the housing 90 also includes a protrusion 92 that extends along the circumference of the housing 90 and protrudes vertically from the lower surface of the housing 90 toward the turntable 2. The protrusion 92 surrounds the second process area P2 below the housing 90. The plasma processing gas nozzles 33 through 35 are accommodated in an area surrounded by the inner circumferential surface of the protrusion 92, the lower surface of the housing 90, and the upper surface of the turntable 2. A part of the protrusion 92 near a base end (at the inner wall of the vacuum chamber 1) of each of the plasma processing gas nozzles 33 through 35 is cut off to form an arc-shaped cut-out that conforms to the outer shape of each of the plasma processing gas nozzles 33 through 35.

As illustrated in FIG. 4, on the lower side (i.e., the second process area P2) of the housing 90, the protrusion 92 is formed along the circumference of the housing 90. The protrusion 92 prevents the seal member 11c from being directly exposed to plasma, i.e., isolates the seal member 11c from the second process area P2. This causes plasma to pass through an area under the protrusion 92 even when plasma spreads from the second process area P2 toward the seal member 11c, thereby deactivating the plasma before reaching the seal member 11c.

Moreover, as illustrated in FIG. 4, the plasma processing gas nozzles 33 through 35 are provided in the third process area P3 under the housing 90, and are connected to an argon gas supply source 120, a helium gas supply source 121 and an oxygen gas supply source 122, respectively. Furthermore, corresponding flow controllers 130, 131 and 132 are provided between the plasma processing gas nozzles 33 through 35 and the argon gas supply source 120, the helium gas supply source 121 and the oxygen gas supply source 122, respectively. Ar gas, He gas and $O_2$ gas are supplied from the argon gas supply source 120, the helium gas supply source 121 and the oxygen gas supply source 122 to each of the plasma processing gas nozzles 33 through 35 at predetermined flow rates (mixing ratios, mix proportions) through each of the flow controllers 130, 131 and 132, and flow rates thereof are determined depending on supplied areas.

Figure 7:
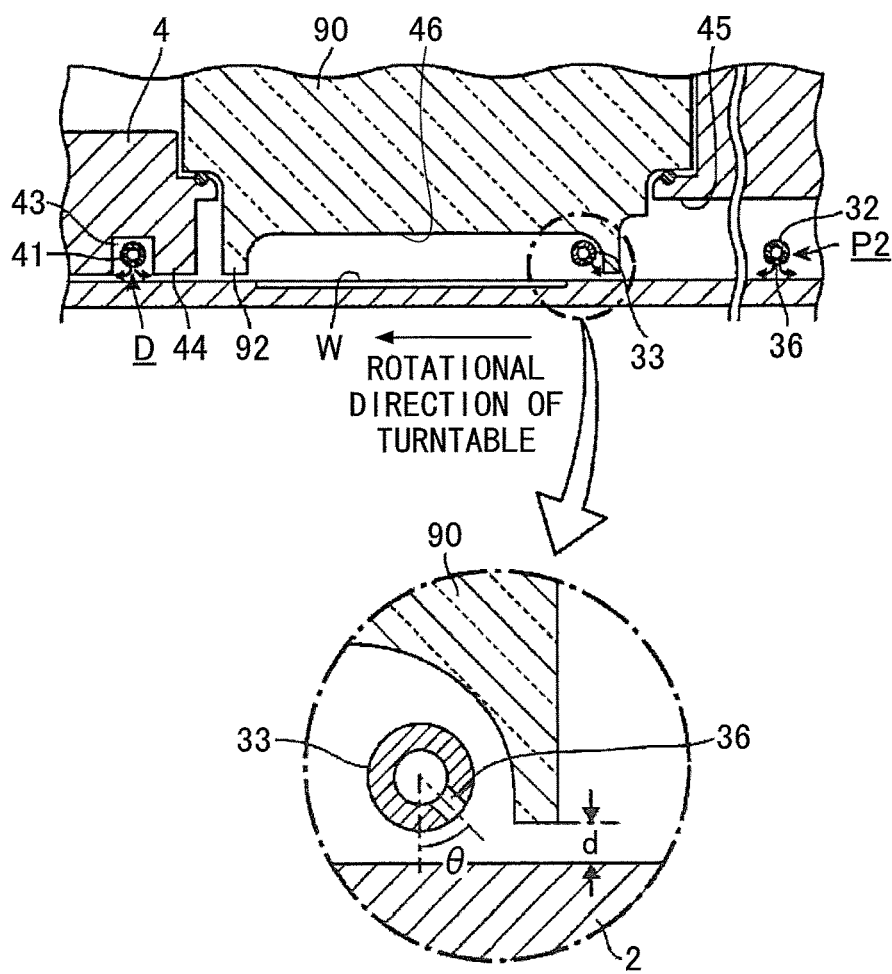
FIG. 7 is a vertical cross-sectional view of a vacuum chamber taken along a rotational direction of a turntable of a plasma processing apparatus according to an embodiment of the present invention.

FIG. 7 is a vertical cross-sectional view of the vacuum chamber 1 taken along the rotational direction of the turntable 2. As illustrated in FIG. 7, because the turntable 2 rotates in a clockwise fashion during the plasma process, Ar gas is likely to intrude into an area under the housing 90 from a clearance between the turntable 2 and the protrusion 92 by being brought by the rotation of the turntable 2. To prevent Ar gas from intruding into the area under the housing 90 through the clearance, a gas is discharged to the clearance from the area under the housing 90. More specifically, as illustrated in FIGS. 4 and 7, the gas discharge holes 36 of the plasma processing gas nozzle 34 are arranged to face the clearance, that is, to face the upstream side in the rotational direction of the turntable 2 and downward. A facing angle θ of the gas discharge holes 36 of the plasma processing gas nozzle 33 relative to the vertical axis may be, for example, about 45 degrees as illustrated in FIG. 7, or may be about 90 degrees so as to face the inner side wall of the protrusion 92. In other words, the facing angle θ of the gas discharge holes 36 may be set at an appropriate angle capable of properly preventing the intrusion of Ar gas in a range from 45 to 90 degrees depending on the intended use.

Figure 8:
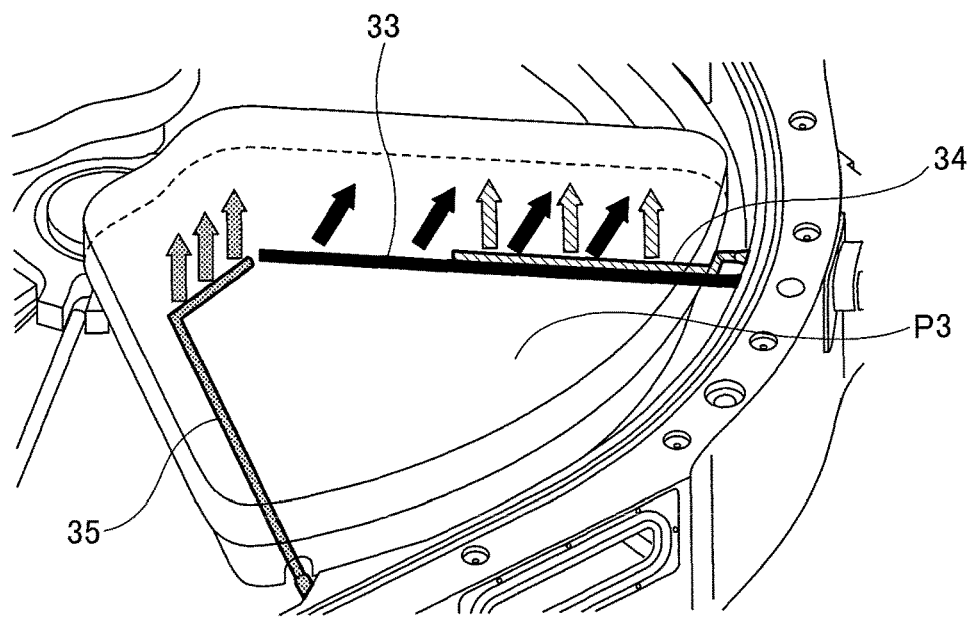
FIG. 8 is an enlarged perspective view of a plasma processing gas nozzle provided in a plasma process area of a plasma processing apparatus according to an embodiment of the present invention.

FIG. 8 is an enlarged perspective view illustrating the plasma processing gas nozzles 33 through 35 provided in the plasma processing area P3. As illustrated in FIG. 8, the plasma processing gas nozzle 33 is a nozzle capable of covering the whole of the concave portion 24 in which the wafer W is placed, and supplying a plasma processing gas to the entire surface of the wafer W. On the other hand, the plasma processing gas nozzle 34 is a nozzle provided slightly above the plasma processing gas nozzle 33 so as to approximately overlap with the plasma processing gas nozzle 33. The length of the plasma processing gas nozzle 34 is about half the length of the plasma processing gas nozzle 33. The plasma processing gas nozzle 35 extends from the outer peripheral wall of the vacuum chamber 1 along the radius of the downstream side of the fan-like plasma process area P3 in the rotational direction of the turntable 2, and has a shape bent linearly along the central area C after reaching the neighborhood of the central area C. Hereinafter, for convenience of distinction, the plasma processing gas nozzle 33 covering the whole area may be referred to as a base nozzle 33, and the plasma processing gas nozzle 34 covering only the outer area may be referred to as an outer nozzle 34. Also, the plasma processing gas nozzle 35 extending to the inside may be referred to as an axis-side nozzle 35.

The base nozzle 33 is a gas nozzle for supplying a plasma processing gas to the whole surface of the wafer W. As illustrated in FIG. 7, the base gas nozzle 33 discharges the plasma processing gas toward the protrusion 92 forming the side surface separating the plasma process area P3 from the other area.

On the other hand, the outer nozzle 34 is a nozzle for supplying a plasma processing gas selectively to an outer area of the wafer W. The plasma processing gas supplied to the plasma process area P3 is converted to plasma by passing through the highest part of the plasma process area P3, which is also close to the plasma generator 81. More specifically, because the plasma generator 81 is provided above the plasma processing area P3, the plasma processing gas flowing along the ceiling surface 46 (see FIG. 7) of the plasma processing area P3 is converted to plasma, which contributes to the plasma process. In other words, the neighborhood of the ceiling surface 46 of the plasma processing area P3 forms a plasma generation area, and the plasma processing gas having passed the plasma generation area is properly converted to the plasma. The outer nozzle 34 performs a process for increasing a flow rate of a plasma processing gas supplied from the outer nozzle 34 and a flow speed of the plasma processing gas of the outer area when an amount of plasma process performed on a film deposited on the wafer W after the plasma process is obtained and the result of the amount of plasma process is insufficient in the outer area. As the flow speed of the plasma processing gas increases, the amount of plasma processing gas converted to the plasma per unit time increases, which accelerates the plasma process. Accordingly, based on this perspective, the gas discharge holes 36 (not illustrated in the drawings) of the outer nozzle 34 are provided to face upward and the ceiling surface 46 of the plasma processing area P3, and are configured to lead the supplied plasma processing gas to the ceiling surface 46 of the plasma process area P2.

The axis-side nozzle 35 is a nozzle for supplying a plasma processing gas selectively to an area near the axis of the turntable 2 of the wafer W. Hence, the gas discharge holes 36 (not illustrated in the drawings) are formed only in a part of the tip of the axis-side nozzle 35 extending along the central area C, and are configured to supply the plasma processing gas to the area of the wafer W near the axis of the turntable 2. In the axis-side nozzle 35, the gas discharge holes 36 also face upward and are provided at a location facing the ceiling surface 46 of the plasma processing area P3. This causes the plasma processing gas supplied from the axis-side nozzle 35 to immediately flow toward the plasma generation area and to be converted to plasma efficiently. In the event that an insufficient plasma process on the wafer W in the area near the axis of the turntable 2 is found when obtaining a processing distribution within a surface of a film on the wafer W after the plasma process, a process for increasing a flow rate and thereby increasing a flow speed of the plasma processing gas supplied from the axis-side nozzle 35 is performed. Because the amount of plasma converted from the plasma processing gas per unit time increases as the flow rate of the plasma processing gas increases, the plasma process is accelerated. In view of this, the gas discharge holes 36 of the outer nozzle 34 (not illustrated in the drawing) are provided to face upward so as to face the ceiling surface 46 of the plasma processing area P3, and are configured to cause the plasma processing gas to flow toward the ceiling surface 46 of the plasma processing area P3.

The axis-side nozzle 35 is a nozzle to mainly supply the plasma processing gas to the central area near the axial side of the turntable 2 on the wafer W. Hence, the gas discharge holes 36 (not illustrated in the drawing) are formed only in a portion of the tip axis-side nozzle 35 along the central area C, and are configured to supply the plasma processing gas to the area on the central side of the wafer W. Even in the axis-nozzle 35, the gas discharge holes 35 face upward and provided in a position opposite to the ceiling surface 456 of the plasma processing area P3. Thus, the plasma processing gas supplied from the axis-side nozzle 35 immediately goes toward the plasma generation area and is efficiently converted to plasma.

In this manner, by providing the outer nozzle 34 and the axis-side nozzle 35 in addition to the base nozzle 33, the flow ratio (mixing ratio, or mix proportion) of the noble gas and the reaction gas contained in the mixed gas can be adjusted for each area, thereby adjusting the quantity of processing across the surface of the film on the wafer W.

The adjustment of the quantity of processing across the surface of the wafer W is generally performed to improve the uniformity of the plasma process across the surface of the wafer W, but when making a difference of the amount of plasma process for each area is desired, a flow ratio of helium gas contained in the plasma processing gas supplied from the nozzles 33 through 35 to the area desired to increase the quantity of processing just has to be increased, and the mixing ratio (mix proportion) of helium gas just has to be increased. Accordingly, in addition to the improvement of the process uniformity across the surface of the wafer W, a variety of adjustments of the quantity of processing is possible.

In this manner, by providing the plasma processing gas nozzles 34 and 35 for flow rate adjustment for each area, the adjustment of the amount of plasma process across the surface can be performed readily and accurately. In FIG. 8, although an example of including three of the plasma processing gas nozzles 33 through 35 is illustrated, the adjustment of the quantity of processing across the surface may be performed more finely and accurately by installing more plasma processing gas nozzles. The number, a shape, an installation location and the like of the plasma processing gas nozzles 33 through 35 can be changed depending on the intended use.

Next, a detailed description is given below of a Faraday shield 95 of the plasma generator 81. As illustrated in FIGS. 4 and 5, a Faraday shield 95 is provided on the upper side of the housing 90. The Faraday shield 95 is grounded, and is composed of a conductive plate-like part such as a metal plate (e.g., copper plate) that is shaped to roughly conform to the internal shape of the housing 90. The Faraday shield 95 includes a horizontal surface 95*a* that extends horizontally along the bottom surface of the housing 90, and a vertical surface 95*b* that extends upward from the outer edge of the horizontal surface 95*a* and surrounds the horizontal surface 95*a*. The Faraday shield 95 may be configured to be, for example, a substantially hexagonal shape in a plan view.

Figure 9:
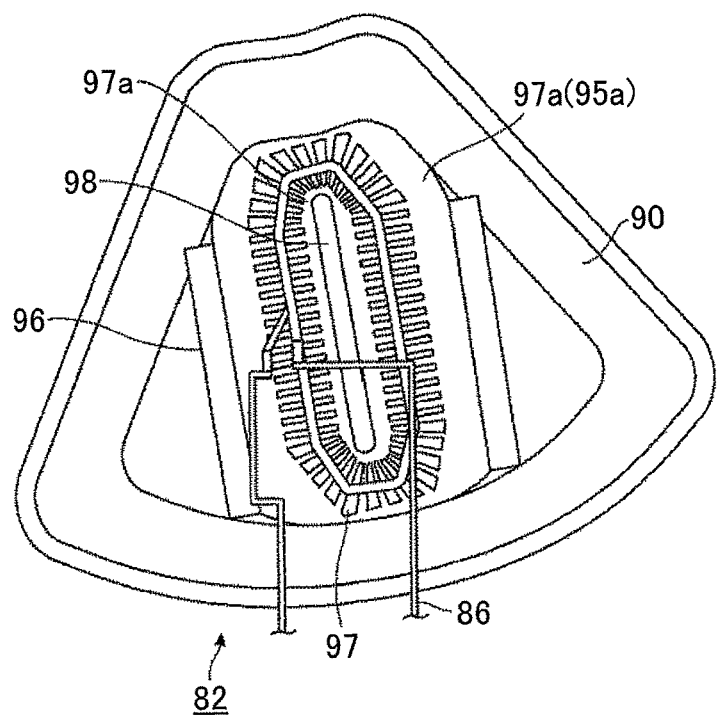
FIG. 9 is a plan view of an example of a plasma generator of a plasma processing apparatus according to an embodiment of the present invention.
Figure 10:
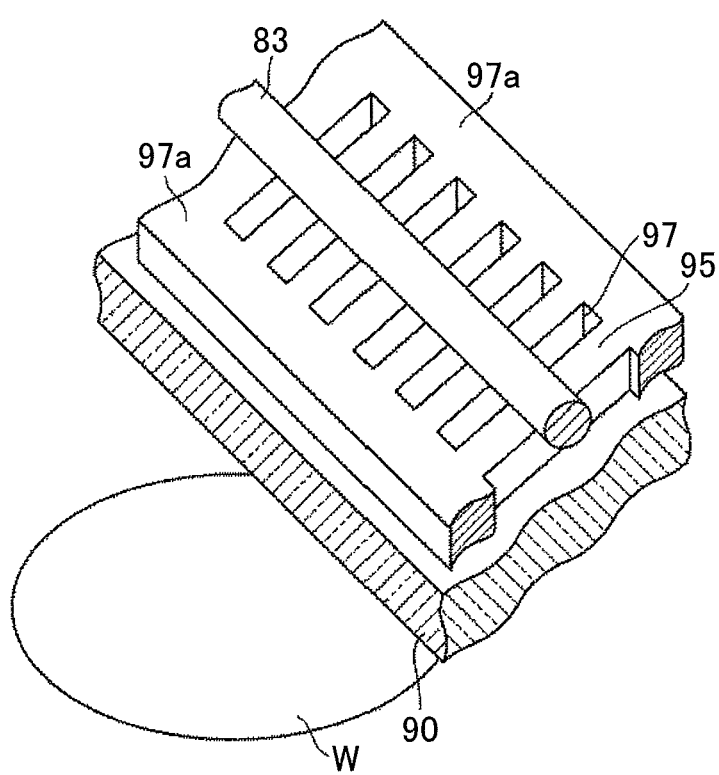
FIG. 10 is a perspective view illustrating a part of a Faraday shield provided in a plasma generator of a plasma processing apparatus according to an embodiment of the present invention.

FIG. 9 is a plan view of an example of the plasma generator 81. FIG. 10 is a perspective view of a part of the Faraday shield 95 provided in the plasma generator 81.

When seen from the rotational center of the turntable 2, the right and left upper ends of the Faraday shield 95 extend horizontally rightward and leftward, respectively, to form supports 96. A frame 99 is provided between the Faraday shield 95 and the housing 90 to support the supports 96 from below. The frame 99 is supported by a part of the housing 90 near the central area C and a part of the flange part 90*a* near the outer edge of the turntable 2.

When an electric field reaches the wafer W, for example, electric wiring and the like formed inside the wafer W may be electrically damaged. To prevent this problem, as illustrated in FIG. 10, a plurality of slits 97 is formed in the horizontal surface 95*a*. The slits 97 prevent an electric-field component of an electric field and a magnetic field (electromagnetic field) generated by the antenna 83 from reaching the wafer W below the Faraday shield 95, and allow a magnetic field component of the electromagnetic field to reach the wafer W.

As illustrated in FIGS. 9 and 10, the slits 97 extend in directions that are orthogonal to the direction in which the antenna 83 is wound, and are arranged to form a circle below the antenna 83. The width of each slit 97 is set at a value that is about $\frac{1}{10000}$ or less of the wavelength of a high frequency supplied to the antenna 83. Circular electrically-conducting paths 97*a* made of, for example, a grounded conductor are provided at the ends in the length direction of the slits 97 to close the open ends of the slits 97. An opening 98 is formed in an area of the Faraday shield 95 where the slits 97 are not formed, i.e., an area surrounded by the antenna 83. The opening 98 is used to check whether plasma is emitting light. In FIG. 2, the slits 97 are omitted for simplification, but an area where the slits 97 are formed is indicated by a dashed-dotted line.

As illustrated in FIG. 5, an insulating plate 94 is stacked on the horizontal surface 95*a* of the Faraday shield 95. The insulating plate 94 is made of, for example, quartz having a thickness of about 2 mm, and is used for insulation between the Faraday shield 95 and the plasma generator 81 disposed above the Faraday shield 95. Thus, the plasma generator 81 is arranged to cover the inside of the vacuum chamber 1 (i.e., the wafer W on the turntable 2) through the housing 90, the Faraday shield 95, and the insulating plate 94.

Next, other components of the substrate processing apparatus according to the present embodiment are described below.

As illustrated in FIG. 2, a side ring 100, which is a cover, is provided along the outer circumference of the turntable 2 and slightly below the turntable 2. First and second exhaust openings 61 and 62, which are apart from each other in the circumferential direction, are formed in the upper surface of the side ring 100. More specifically, the first and second exhaust openings 61 and 62 are formed in the side ring 100 at locations that correspond to exhaust ports formed in the bottom surface of the vacuum chamber 1.

In the present specification, one and the other of the exhaust openings 61 and 62 are referred to as a first exhaust opening 61 and a second exhaust opening 62, respectively. The first exhaust opening 61 is formed at a location that is between the first process gas nozzle 31 and the separation area D located downstream of the first process gas nozzle 31 in the rotational direction of the turntable 2, and is closer to the separation area D than to the first process gas nozzle 31. The second exhaust opening 62 is formed at a location that is between the plasma generator 81 and the separation area D located downstream of the plasma generator 81 in the rotational direction of the turntable 2, and is closer to the separation area D than to the plasma generator 81.

The first exhaust opening 61 is configured to evacuate the first process gas and the separation gas, and the second exhaust opening 62 is configured to evacuate the plasma processing gas and the separation gas. Each of the first exhaust opening 61 and the second exhaust opening 62 is connected to a vacuum pump 64 that is an example of an evacuation mechanism through an evacuation pipe 63 including a pressure controller 65 such as a butterfly valve.

Here, gases flowing from the upstream in the rotational direction of the turntable 2 to the third process area P3 and then flowing toward the second exhaust opening 62 may be blocked by the housing 90 extending from the central area C toward the outer wall of the vacuum chamber 1. For this reason, a groove-like gas flow passage 101 to allow the gases to flow therethrough is formed in the upper surface of the side ring 100 at a location closer to the outer wall of the vacuum chamber 1 than the outer end of the housing 90.

As illustrated in FIG. 1, a protruding portion 5 having a substantially ring shape is formed on a central part of the lower surface of the top plate 11. The protruding portion 5 is connected with the inner ends (that face the central area C) of the convex portions 4. The height of the lower surface of the protruding portion 5 is substantially the same as the height of the lower surfaces (the ceiling surfaces 44) of the convex portions 4. A labyrinth structure 110 is formed above the core portion 21 at a location closer to the rotational center of the turntable 2 than the protruding portion 5. The labyrinth structure 110 prevents gases from mixing with each other in the central area C.

As described above, the housing 90 extends up to a location near the central area C. Therefore, the core portion 21 for supporting the central part of the turntable 2 is formed near the rotational center so that a part of the core portion 21 above the turntable 2 does not contact the housing 90. For this reason, compared with outer peripheral areas, gases are likely to mix with each other in the central area C. The labyrinth structure 110 above the core portion 21 lengthens gas flow passage and thereby prevents gases from mixing with each other.

As illustrated in FIG. 1, a heater unit 7 is provided in a space between the turntable 2 and the bottom part 14 of the vacuum chamber 1. The heater unit 7 can heat, through the turntable 2, the wafer W on the turntable 2 to a temperature, for example, in a range from about room temperature to about 300 degrees C. In FIG. 1, a side covering member 71a is provided on a lateral side of the heater unit 7, and an upper covering member 7a is provided above the heater unit 7 to cover the heater unit 7. Purge gas supply pipes 73 are provided in the bottom part 14 of the vacuum chamber 1 below the heater unit 7. The purge gas supply pipes 73 are arranged at a plurality of locations along the circumferential direction and used to purge the space where the heater unit 7 is placed.

As illustrated in FIG. 2, the transfer opening 15 is formed in the side wall of the vacuum chamber 1. The transfer opening 15 is used to transfer the wafer W between a transfer arm 10 and the turntable 2. A gate valve G is provided to hermetically open and close the transfer opening 15. A camera unit 10a is provided above the top plate 11 in an area where the transfer arm 10 is moved into and out of the vacuum chamber 1. The camera unit 10a is used to detect the outer edge (or rim) of the wafer W. The camera unit 10a captures an image of the outer edge of the wafer W and thereby detects, for example, whether the wafer W is on the transfer arm 10, misalignment of the wafer W on the turntable 2, and misalignment of the wafer W on the transfer arm 10. The camera unit 10a is configured to have a wide field of view that covers the diameter of the wafer W.

The wafer W is transferred between the concave portion 24 of the turntable 2 and the transfer arm 10 when the concave portion 24 is at a position (transfer position) facing the transfer opening 15. For this reason, lifting pins and an elevating mechanism (not illustrated in the drawings) for lifting the wafer W are provided at the transfer position under the turntable 2. The lifting pins pass through the concave portion 24 and push the back surface of the wafer W upward.

The plasma processing apparatus of the embodiment also includes a control unit 120 implemented by a computer for controlling the operations of the entire substrate processing apparatus. The control unit 120 includes a memory that stores a program for causing the substrate processing apparatus to perform a substrate process described later. The program may include steps for causing the substrate process apparatus to perform various operations. The program may be stored in a storage unit 121 that forms a storage medium such as a hard disk, a compact disc, a magneto-optical disk, a memory card, or a flexible disk, and installed from the storage unit 121 into the control unit 120.

[Plasma Processing Method]

Next, a plasma processing method according to an embodiment of the present invention is described below. Although the plasma processing method according to the present embodiment can be applied to an etching apparatus and another type of film deposition apparatus in addition to the plasma processing apparatus by ALD described above, the plasma processing method of the present embodiment is described below by citing an example of using the above-mentioned plasma processing apparatus for convenience of explanation.

As described above, the plasma processing apparatus according to the embodiment of the present invention includes three of the plasma processing gas nozzles 33 through 35 that can supply different types of plasma processing gases to different areas in the plasma processing area P3. To begin with, a function of the plurality of plasma processing gas nozzles 33 through 35 is described below.

Figure 11A:
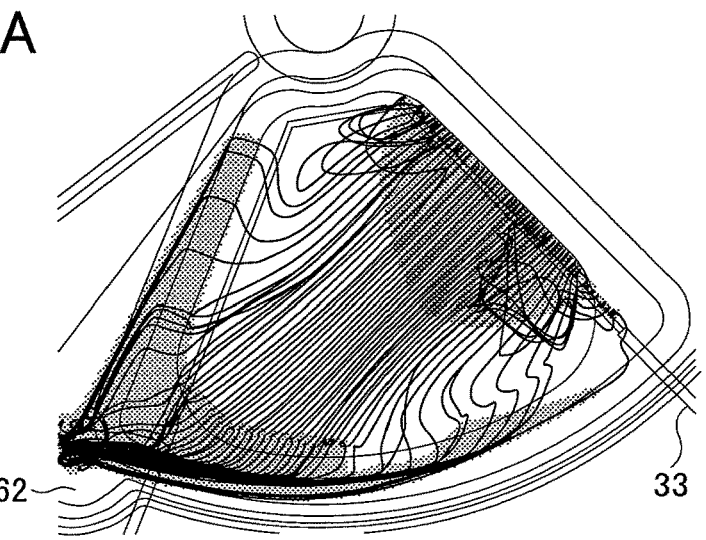
FIG. 11A is a diagram showing a simulation result of a trajectory of a plasma processing gas when a plasma processing gas of 10% is supplied from a base nozzle.
Figure 11B:
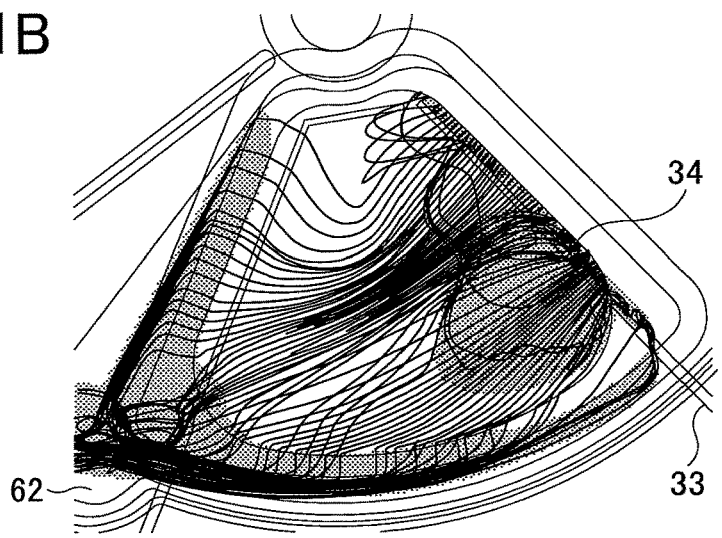
FIG. 11B is a diagram showing a simulation result of a trajectory of a plasma processing gas when a plasma processing gas of 60% is supplied from a base nozzle and a plasma processing gas of 40% is supplied from an outer nozzle.
Figure 11C:
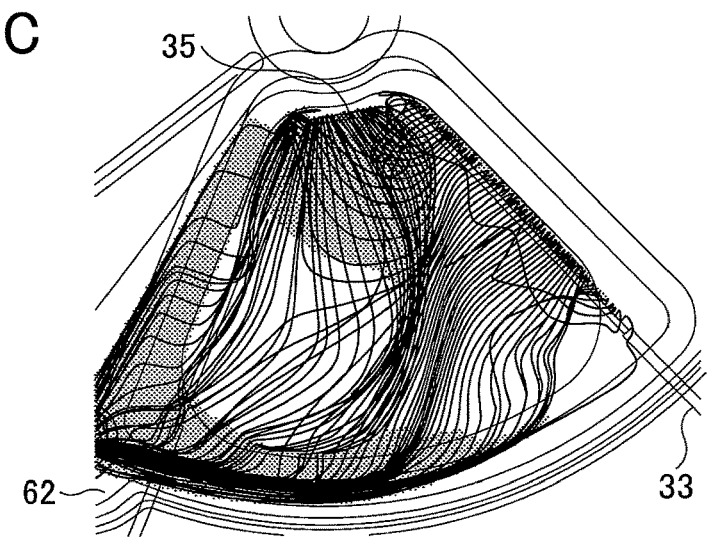
FIG. 11C is a diagram showing a simulation result of a trajectory of a plasma processing gas when a plasma processing gas of 60% is supplied from a base nozzle and a plasma processing gas of 40% is supplied from an axial-side nozzle.

FIGS. 11A through 11C are diagrams showing simulation results of a gas flow rate adjustment by the plurality of plasma processing gas nozzles 33 through 35 provided in the plasma processing area P3.

FIG. 11A is a diagram showing a simulation result of trajectories of a plasma processing gas when 100% of the plasma processing gas is supplied from the base nozzle 33. In FIG. 11A, an area having a thick color near the base nozzle is an area where the flow speed and the flow rate of the plasma processing gas is great. This point is the same even in FIGS. 11B and 11C. As illustrated in FIG. 11A, the plasma processing gas is supplied from the entire base gas nozzle 33 and flows toward the exhaust opening 62.

FIG. 11B is a diagram showing a simulation result of trajectories of a plasma processing gas when 60% of the plasma processing gas is supplied from the base nozzle 33, and 40% of the plasma processing gas is supplied from the outer nozzle 34. As illustrated in FIG. 11B, it is noted that there is an area having a thick color at an outer location by supplying the plasma processing gas from the outer nozzle 34 and that the flow speed and the flow rate at the outer area more increases than those of FIG. 11A.

FIG. 11C is a diagram showing a simulation result of trajectories of a plasma processing gas when 60% of the plasma processing gas is supplied from the base nozzle 33, and 40% of the plasma processing gas is supplied from the axis-side nozzle 35. As illustrated in FIG. 11C, it is noted that there is an area having a thick color at a location on the central (axial) side by supplying the plasma processing gas from the axis-side nozzle 35 and that the flow speed and the flow rate at the central area more increases than those of FIG. 11A.

Thus, FIGS. 11A through 11C indicates that the adjustment that increases the flow rate on the outer side and the axial side can be performed by providing the outer nozzle 34 and the axis-side nozzle 35 in addition to the base nozzle 33.

Next, properties of the noble gas used as the plasma processing gas are described below. More specifically, a variety of properties of Ar gas and He gas is described below.

Figure 12A:
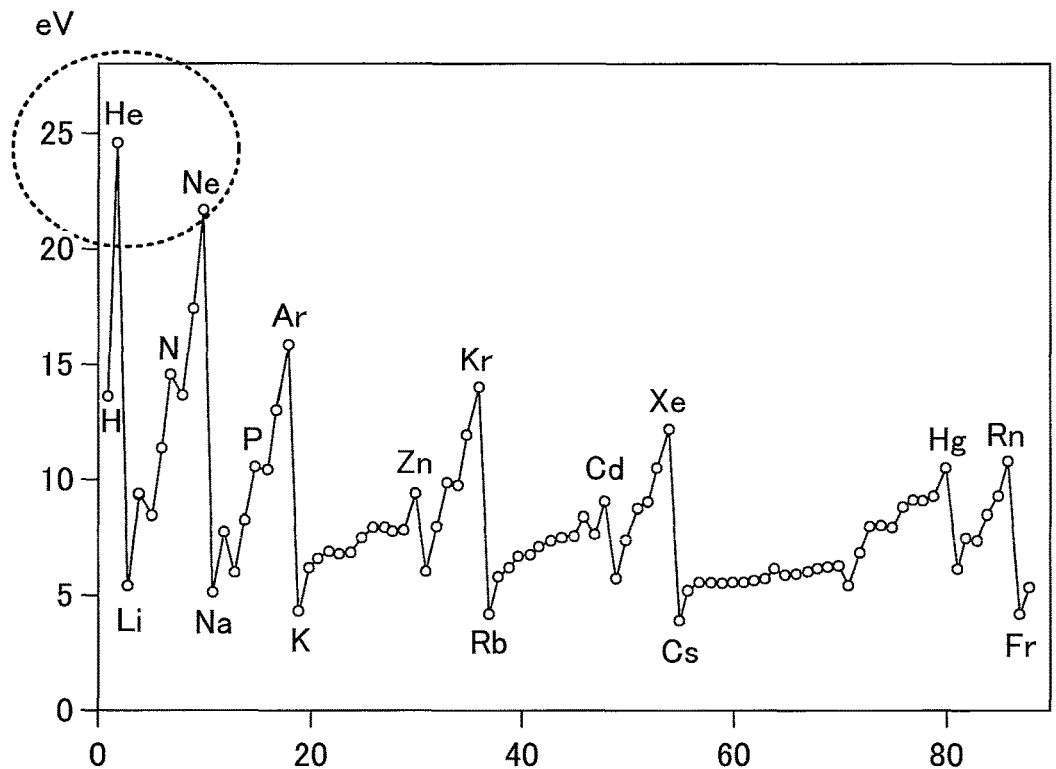
FIG. 12A is a graph showing ionization energy of a variety of active species.
Figure 12B:
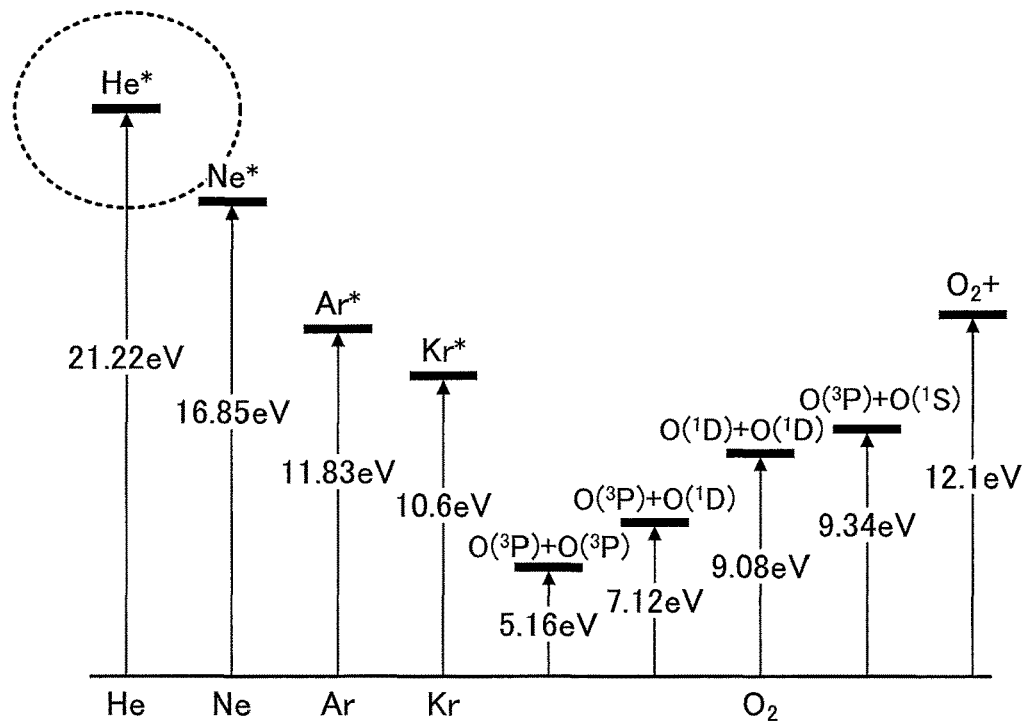
FIG. 12B is a graph showing energy of radicals of a variety of active species.

FIGS. 12A and 12B are graphs showing energy of active species. FIG. 12A is a graph showing ionization energy of each of the active species. FIG. 12B is a graph showing radical energy of each of the active species.

FIG. 12A shows that the ionization energy of He is about 25 eV, and that the ionization energy of Ar is about 15 eV. In other words, He has about 1.67 times as much ionization energy as Ar. Moreover, He has the highest ionization energy among the cited active species.

Furthermore, FIG. 12B indicates that energy of He* is 21.22 eV and that energy of Ar* is 11.83 eV. In other words, He* has about 1.79 times as much energy as Ar*. In addition, He* indicates the highest energy among the cited active species.

These data indicate that using He gas as the plasma processing gas can be greatly expected to improve the modification effect.

Figure 13:
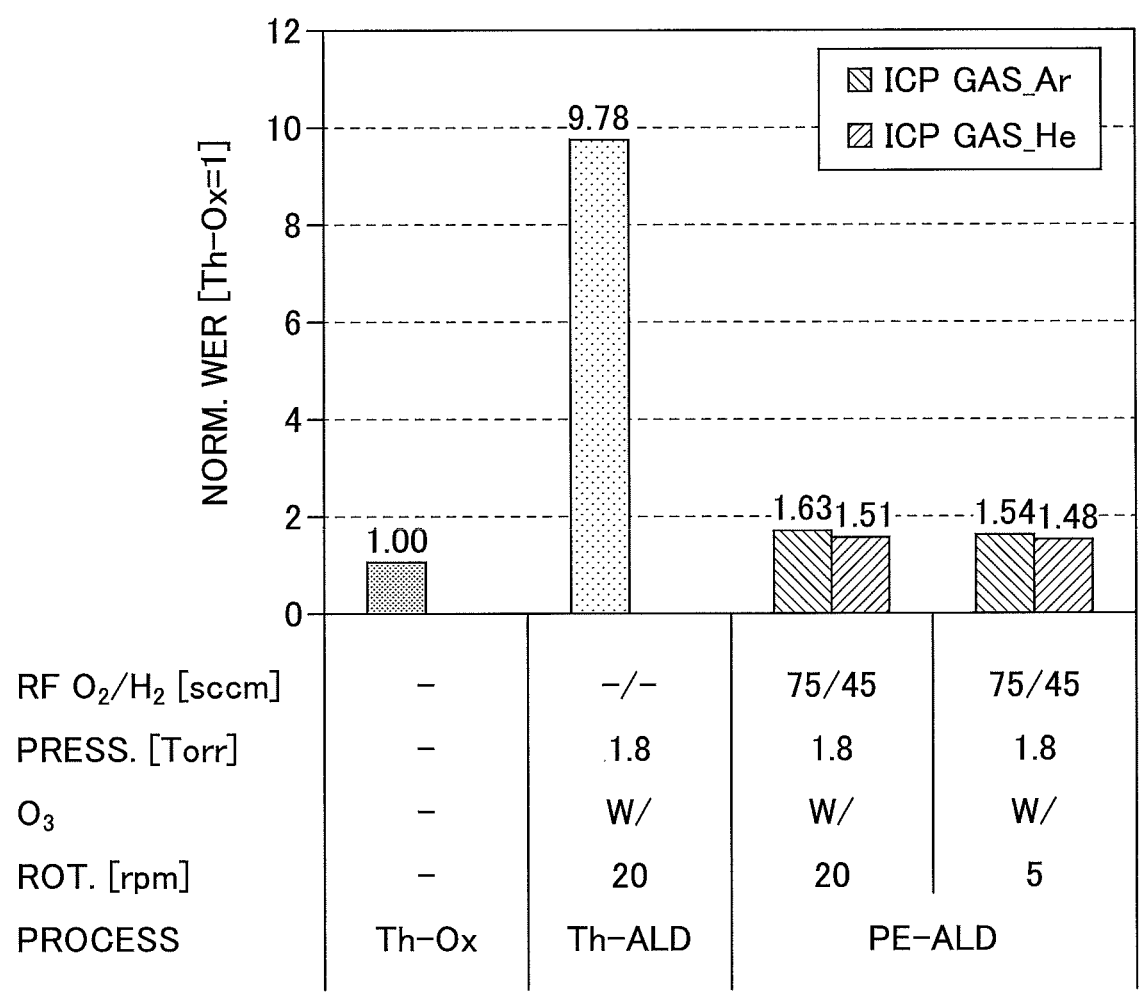
FIG. 13 is a diagram showing an experimental result comparing a wet etching rate in performing a plasma modification process using a mixed gas containing Ar with a wet etching rate in performing a plasma modification process using a mixed gas containing He.

FIG. 13 shows an experimental result of comparing an etching rate when performing a plasma modification process using a mixed gas of Ar, $O_2$ and $H_2$ with an etching rate when performing the plasma modification process using a mixed gas of He, $O_2$ and $H_2$, after depositing a silicon oxide film ($SiO_2$).

First, in depositing the silicon oxide film ($SiO_2$), the film deposition was performed by setting the pressure of the vacuum chamber 1 at 1.8 Torr, the temperature of the wafer W at 400 degrees C., and the rotational speed of the turntable 2 at 20 rpm, and by supplying $O_3$ gas from the second process gas nozzle 32.

Then, in the plasma processing area P3, the flow ratio of Ar (He)/$O_2$/$H_2$ of the plasma processing gas was set at 15 slm/75 sccm/45 sccm. While the pressure of the vacuum chamber 1 was maintained at 1.8 Torr, the experiment was conducted on both cases of supplying $O_3$ gas from the second process gas nozzle 32 and supplying nothing from the second process gas nozzle 32 regarding the oxidation gas, and on both cases of rotating the turntable 2 at 20 rpm and 5 rpm regarding the rotational speed of the turntable 2.

The leftmost column shows a comparative example of a film deposition using a vertical thermal processing furnace when not performing a modification process. The second data from the left are a comparative example of film deposition using a turntable type film deposition apparatus when not performing a plasma process. Three examples on the right side are experimental results using the plasma processing apparatus according to the embodiment of the present invention.

In any experimental result, a lower wet etching rate could be obtained by using He than using Ar and not performing the plasma process. Here, a film having the lower wet etching rate means a fine (dense or high-density) and high-quality film because the film is difficult to be etched. Hence, the result shown in FIG. 13 indicates that a high-density and high-quality film can be obtained by performing a modification process using He than using Ar under any conditions.

Figure 14:
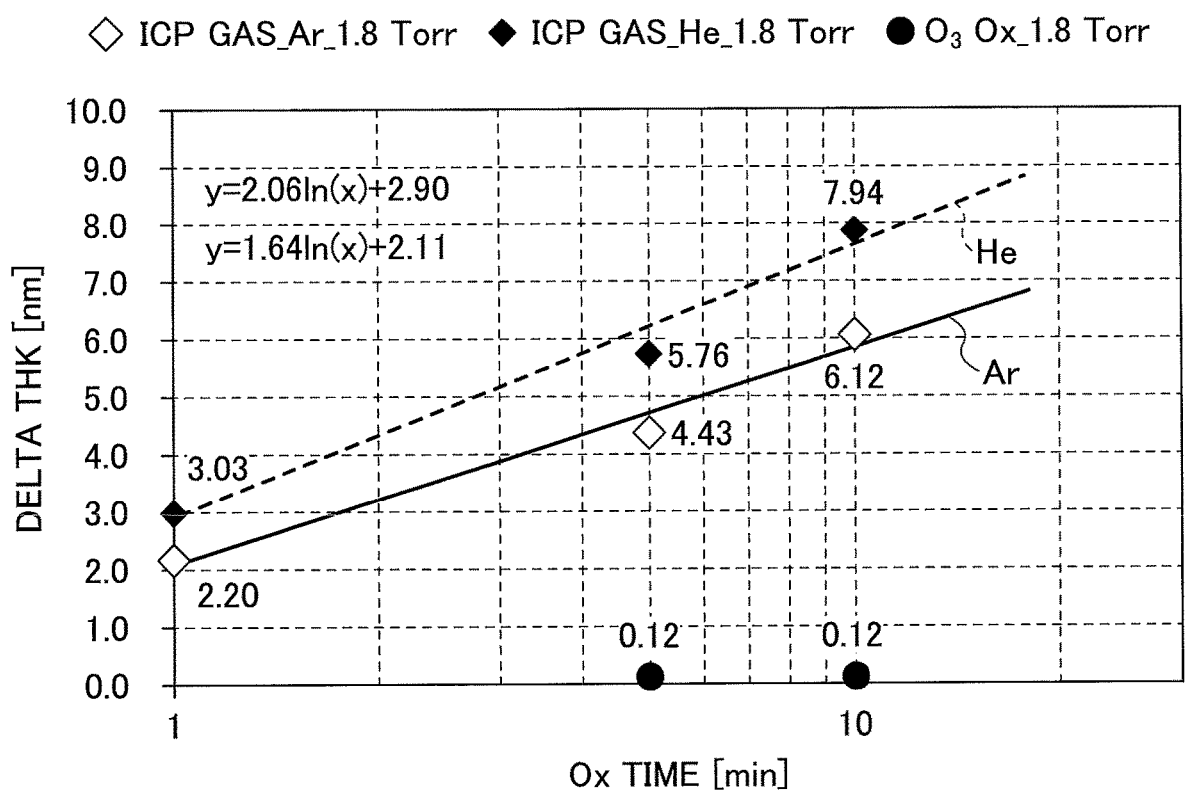
FIG. 14 is graph showing an experimental result measuring an oxidation effect when oxidizing a silicon substrate by plasma modification process.

FIG. 14 is a graph showing experimental results of measuring oxidation power when a silicon substrate is oxidized by plasma modification process. The pressure in the vacuum chamber 1 was set at 1.8 Torr; the temperature of the wafer W was set at 400 degrees C.; and the output of the RF power source was set at 3.3 kW. With respect to the mixed gas containing He and Ar, the flow ratio of Ar (He)/$O_2$/$H_2$ was set at 15 slm/75 sccm/45 sccm, respectively.

In FIG. 14, the horizontal axis shows oxidation time, and the vertical axis shows a thickness of an oxide film ($SiO_2$). A case of using a mixed gas composed of He, $O_2$ and $H_2$ could obtain a thicker oxide film and a higher deposition rate (i.e., slope) than a case of using a mixed gas composed of Ar, $O_2$ and $H_2$. More specifically, after a lapse of 1 minute, while a 3.0 nm-thick oxide film was deposited when using He, only a 2.2 nm-thick oxide film was deposited when using Ar. Moreover, after a lapse of 10 minutes, while a 7.94 nm-thick oxide film was deposited when using He, only a 6.12 nm-thick film was deposited when using Ar. Furthermore, while a slope of a line showing an amount of deposition of the oxide film when using He over time was 2.06, a slope of a line showing an amount of deposition of the oxide film when using Ar over time was only 1.64.

Thus, even with respect to the oxidation power, FIG. 14 indicated that the more preferable result could be obtained by using the mixed gas containing He than the mixed gas containing Ar.

Based on the results shown in FIGS. 12A through 14, a tendency for the modification effect to decrease on the peripheral side due to the difference in angular velocity when the turntable 2 rotates, can be corrected. More specifically, by supplying the plasma processing gas composed of the mixed gas containing He from the outer nozzle 34 and by supplying the plasma processing gas composed of the mixed gas containing Ar from the axis-side nozzle 33, the uniformity across the surface of the wafer W of the modification effect can be enhanced, and as a result, the uniformity across the surface of the wafer W can be improved in terms of the film thickness of the deposited film, the coverage property, the film quality.

Such a plasma processing method according to an embodiment of the present invention is described below.

To begin with, to carry substrates such as the wafers W into the vacuum chamber 1, the gate valve G is opened. Next, while the turntable 2 is being rotated intermittently, the wafers W are carried into the vacuum chamber 1 through the transfer opening 15 and placed on the turntable 2 by the transfer arm 10.

Next, the gate valve G is closed, and the pressure in the vacuum chamber 1 is adjusted to a predetermined pressure value by the vacuum pump 64 and the pressure controller 65. Then, the wafers W are heated to a predetermined temperature by the heater unit 7 while rotating the turntable 2. At this time, a separation gas, for example, Ar gas is supplied from the separation gas nozzles 41 and 42.

Subsequently, the first process gas nozzle 31 supplies a first process gas, and the second process gas nozzle 32 supplies a second process gas. Moreover, each of the plasma processing gas nozzles 33 through 35 supplies a plasma processing gas at a predetermined flow rate.

Here, although a variety of gases may be used as the first process gas, the second process gas and the plasma processing gas, the first process gas nozzle 31 supplies a source gas, and the second process gas nozzle 32 supplies an oxidation gas or a nitriding gas. Moreover, the plasma processing gas nozzles 33 through 35 supply an oxidation gas or a nitriding gas similar to the oxidation gas and the nitriding gas supplied from the second process gas nozzle, and a plasma processing gas composed of a mixed gas containing a noble gas. A plurality kinds of noble gases with different ionization energy or radical energy is used as the noble gas, and noble gases composed of different types or mixed at different mixing ratios (mix portions) are used depending on supply areas of the plasma processing gas nozzles 33 through 35.

The plasma processing method of the present embodiment is described below by citing an example in which the film to be deposited is a silicon oxide film; the first process gas is an organic aminosilane gas; the second process gas is oxygen gas; and the plasma processing gas is composed of a mixed gas of He, Ar and $O_2$.

A Si-containing gas or a metal containing gas is adsorbed on the surface of the wafer in the first process area P1 due to the rotation of the turntable 2, and then the Si-containing gas adsorbed on the surface of the wafer W is oxidized by oxygen gas in the second process area P2. Thus, one or more molecular layers of a silicon oxide film that is a component of a thin film are deposited on the surface of the wafer W and a reaction product is deposited on the surface of the wafer W.

When the turntable 2 further rotates, the wafer W reaches the plasma processing area P3, and a modification process of the silicon oxide film by a plasma process is performed. With respect to the plasma processing gas supplied in the plasma processing area P3, for example, the base nozzle 33 supplies a mixed gas of Ar, He and $O_2$ containing Ar and He at a mixing ratio of 1:1; the outer nozzle 34 supplies a mixed gas containing He and $O_2$ and not containing Ar; and the axis-side nozzle 35 supplies a mixed gas containing Ar and $O_2$ and not containing He. Thus, the base nozzle 33 supplies the mixed gas containing Ar and $O_2$ at a ratio of 1:1, which is made as a standard, and the mixed gas having a weaker modification effect than the mixed gas supplied from the base nozzle 33 to the central-axis-side area where the angular velocity is low and the quantity of plasma processing is likely to be great. In contrast, the mixed gas having a stronger modification effect than the mixed gas supplied from the base nozzle 33 is supplied to the peripheral area where the angular velocity is high and the quantity of plasm processing is likely to be insufficient. By doing this, the influence of the angular velocity of the turntable 2 can be reduced, and the uniform plasma process can be performed in the radial direction of the turntable 2.

When the plasma process is performed in the plasma processing area P3, radio frequency power of a predetermined output is supplied to the antenna 83 at the plasma generator 81.

In the housing 90, the electric field of the electromagnetic field generated by the antenna 83 is prevented from entering the vacuum chamber 1 by being reflected, absorbed or attenuated by the Faraday shield.

The Faraday shield 95 includes the electrically-conducting paths 97a at the ends in the length direction of the slits 97, and the vertical surface 95b disposed lateral to the antenna 83. This configuration also blocks the electric field likely to to go around the slits 97 and move toward the wafer W through areas at the ends in the length direction of the slits 97.

On the other hand, because the slits 97 are formed in the Faraday shield 95, the magnetic field passes through the slits 97 of the Faraday shield 95, and enters the vacuum chamber 1 through the bottom surface of the housing 90. As a result, the plasma processing gases are converted into plasma by the magnetic field in an area under the housing 90. This makes it possible to generate plasma including many active species that are less likely to electrically damage the wafer W.

In the present embodiment, by continuing to rotate the turntable 2, the adsorption of the source gas on the surface of the wafer W, oxidation or nitriding of components adsorbed on the wafer surface, and plasma modification of the reaction product are performed in this order many times. In other words, the film deposition process by ALD and the modification process of the deposited film are performed many times by the rotation of the turntable 2.

In the plasma processing apparatus of the present embodiment, the separation areas D are provided between the first and second process areas P1 and P2, and between the third and first process areas P3 and P1 along the circumferential direction of the turntable 2. Thus, the process gas and the plasma processing gas are prevented from mixing with each other by the separation areas D, and are evacuated from the first and second exhaust openings 61 and 62.

The first process gas of the present embodiment may be a silicon-containing gas such as DIPAS [diisopropylaminosilane], 3DMAS [trisdimethylaminosilane] gas, BTBAS [bistertialbutylaminosilane], DCS [dichlorosilane], and HCD [hexachlorodisilane] as examples.

In addition, when the plasma processing method according to the embodiment of the present invention is applied to film deposition of a TiN film, the first process gas may be a metal containing gas such as $TiCl_4$ [titanium tetrachloride], Ti(MPD)(THD) [titanium methylpentanedionatobistetramethylheptanedionato], TMA [trimethylaluminum], TEMAZ [tetrakisethylmethylaminozirconium], TEMHF [tetrakisethylmethylaminohafnium], and Sr(THD)2 [strontium bistetramethylheptanedionato].

In the present embodiment, the plasma processing gas is described by citing an example of using Ar gas and He gas as the noble gases by combining with oxygen gas for modification, but another noble gas may be used, and ozone gas or moisture can be used instead of oxygen gas.

In a process for depositing a nitriding film, $NH_3$ gas or $N_2$ gas may be used for modification. Furthermore, a mixed gas further containing a hydrogen-containing gas (e.g., $H_2$ gas, $NH_3$ gas) may be used as necessary.

As the separation gas, for example, $N_2$ gas is cited as an example instead of Ar gas.

Although the flow rate of the first process gas during the film deposition process is not limited to a specific value, the flow rate of the first process gas during the film deposition process can be set in, for example, a range from 50 sccm and 1000 sccm.

Although the flow rate of the oxygen-containing gas contained in the plasma processing gas is not limited to a specific value, the flow rate of the oxygen-containing gas contained in the plasma processing gas can be, for example, set in a range from about 500 sccm to about 5000 sccm (e.g., 500 sccm as an example).

Although the pressure in the vacuum chamber 1 is not limited to a specific value, the pressure can be, for example, set in a range from 0.5 Torr to about 4 Torr (e.g., 1.8 Torr as an example).

Although the temperature of the wafer W is not limited to a specific value, the temperature can be set, for example, in a range from about 40 degrees C. to about 650 degrees C.

Although the rotational speed of the turntable 2 is not limited to a specific value, the rotational speed can be set, for example, in a range from about 60 rpm to about 300 rpm.

[Simulation Results]

Next, simulation results simulating the plasma processing method and the plasma processing apparatus according to an embodiment of the present invention are described below.

FIGS. 15A through 15C are diagrams showing a first simulation result of the plasma processing method and plasma processing apparatus according to an embodiment of the present invention. FIG. 15A is a diagram for showing a positional relationship of the plasma processing apparatus according to the present embodiment of the present invention. As shown in FIG. 15A, the following simulation results are shown when the plasma processing area P3 is arranged at a lower position in the drawing, at a position of 6 o'clock.

With respect to process conditions, the pressure in the vacuum chamber 1 is 2 Torr; the temperature of the wafer W is 400 degrees C.; and the rotational speed of the turntable 2 is 20 rpm. The flow rate of Ar gas from the separation gas supply pipe 51 is 1 slm, and the flow rate of Ar gas from the separation gas nozzles 41 and 42 are 5 slm, respectively. With respect to the source gas, the first process gas nozzle 31 supplies an organic aminosilane gas at a flow rate of 300 slm, with Ar gas that is used as a carrier gas at a flow rate of 1 slm. With respect to the reaction gas, the second process gas nozzle 32 supplies oxygen gas at a flow rate of 6 slm. With respect to the plasma processing area P3, the base nozzle 33 supplies a mixed gas of $Ar/He/O_2$ at flow rates of 7.5 slm/2.5 slm/50 sccm. The outer nozzle 34 supplies a mixed gas of $Ar/He/O_2$ at flow rates of 2.5 slm/2.5 slm/25 sccm. The axis-side nozzle 35 supplies a mixed gas of $Ar/O_2$ at flow rates of 5 slm/25 sccm.

The simulation experiment is performed under the conditions, and concentration distributions of He and Ar above the turntable 2 are calculated. The concentration level of each gas is indicated by a level J, a level K, a level L, a level M and a level N in descending order of concentration.

FIG. 15B is a diagram showing a concentration distribution of He gas above the turntable 2. As shown in FIG. 15B, the level M is present at peripheral area of the plasma processing area P3, and the other area surrounding the level M area indicates the level N that has the lowest concentration level.

FIG. 15C is a diagram showing a concentration of Ar gas above the turntable 2. As shown in FIG. 15C, areas of the levels J and K that have high concentration levels are present on the central axis side in the plasma processing area P3, but the other area in the plasma processing area P3 indicates the level L with a middle concentration level. The separation area D in which the separation gas is supplied indicates the highest level J, and the first process area P1 indicates the level K that has slightly lower concentration level than the level J.

As shown in FIGS. 15B and 15C, in the plasma processing area P3, the concentration of He is high in the area where the outer nozzle 34 supplying He gas is present, and the concentration of Ar is high in the area where the axis-nozzle 35 supplying Ar gas is present, which makes it possible to separately supply each noble gas with different ionization energy and radical energy to each area on purpose by using the regional plasma processing gas nozzles 33 through 35. Thus, it is possible to increase the quantity of plasma processing in the peripheral area of the turntable 2 and to decrease the quantity of plasma processing in the area on the central axis side, thereby canceling and correcting the influence of angular velocity.

Figure 16A:
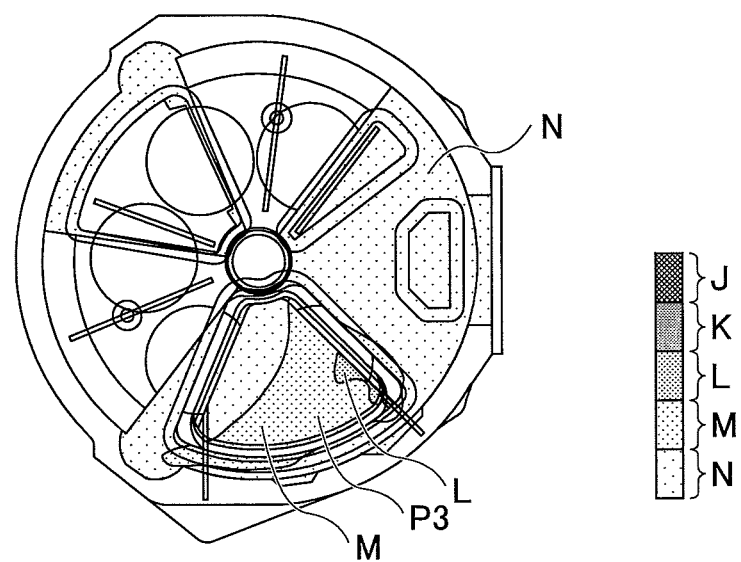
FIG. 16A is a diagram showing a concentration distribution of He gas of an area under an opening of a plasma processing area in the first simulation.
Figure 16B:
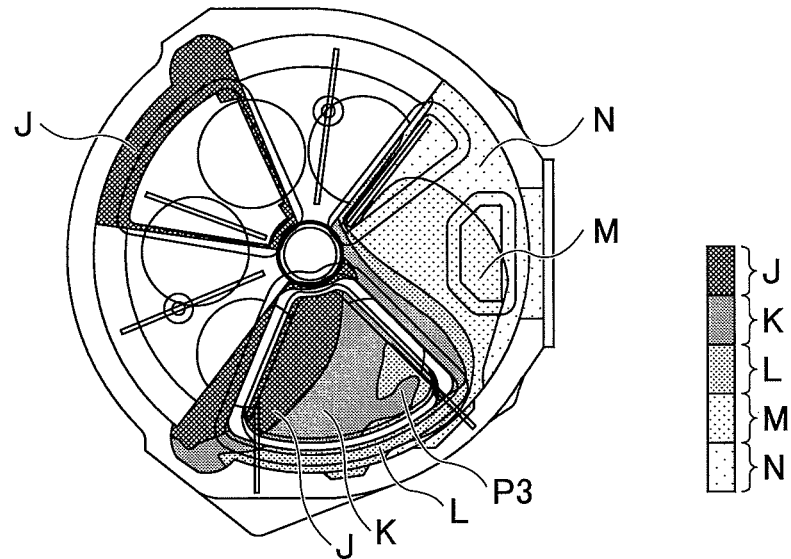
FIG. 16B is a diagram showing a concentration distribution of Ar gas of an area under an opening of a plasma processing area in the first simulation.

FIGS. 16A and 16B are diagrams showing first simulation results of the plasma processing method and plasma processing apparatus according to an embodiment of the present invention in a different area from that of FIG. 15.

FIG. 16A is a diagram showing a concentration distribution of He gas below the opening 11a of the plasma processing area P3. As shown in FIG. 16A, with respect to He, the level L area is present with a middle level concentration in an area near the outer nozzle 34 in the plasma processing area P3, and the level M area is present around the level L area with a lower concentration than the level L area. The other area indicates the level N that has the lowest concentration level.

FIG. 16B is a diagram showing a concentration distribution of Ar gas below the opening 11a of the plasma processing area P3. As shown in FIG. 16B, the levels J and K with the high concentrations are present in an area on the central axis side in the plasma processing area P3, but the other area in the plasma processing area P3 indicates the level L with the middle level concentration.

As shown in FIGS. 16A and 16B, in the plasma processing area P3, the concentration of He is high in the area where the outer nozzle 34 supplying He gas is present, and the concentration of Ar is high in the area where the axis-nozzle 35 supplying Ar gas is present, which makes it possible to separately supply each noble gas with different ionization energy and radical energy to each area on purpose by using the regional plasma processing gas nozzles 33 through 35. Thus, it is possible to increase the quantity of plasma processing in the peripheral area of the turntable 2 and to decrease the quantity of plasma processing in the area on the central axis side, thereby canceling and correcting the influence of angular velocity.

In this manner, from FIGS. 15B and 15C, and FIGS. 16A and 16B, even above the turntable 2 or below the opening 11a, the plasma processing gas can be supplied so that the concentration of He gas is high on the peripheral side of the turntable 2 and that the concentration of Ar gas is high on the central axis side of the turntable 2, thereby correcting the difference in angular velocity between the peripheral side and the central axis side and improving the uniformity across the surface of the wafer W of the plasma processing.

Figure 17A:
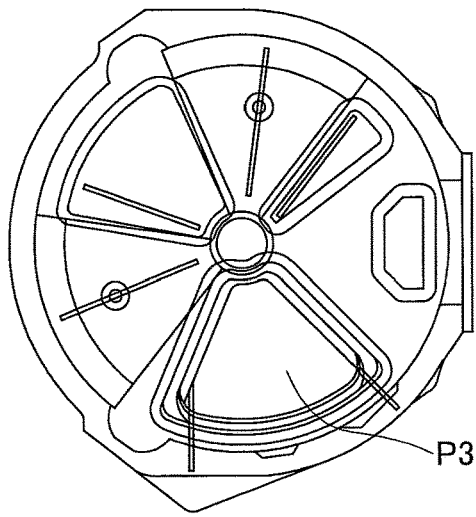
FIG. 17A is a diagram for illustrating a positional relationship of a plasma processing apparatus in a second simulation according to an embodiment of the present invention.
Figure 17B:
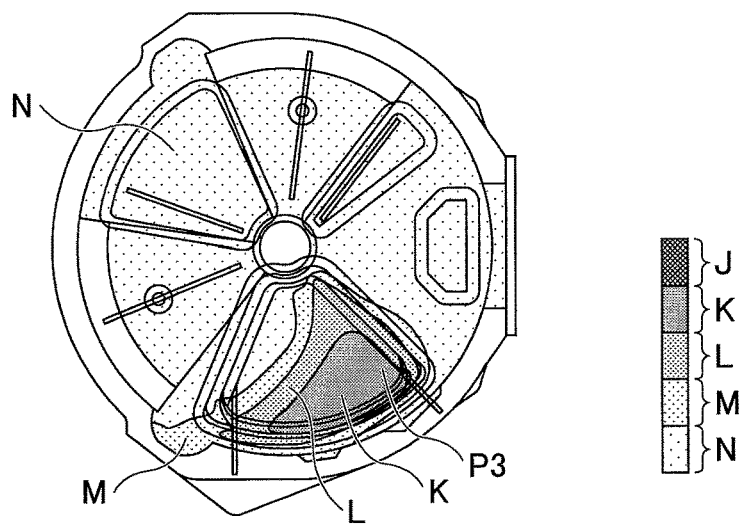
FIG. 17B is a diagram showing a concentration distribution of He gas of an area under an opening of a plasma processing area in the second simulation.
Figure 17C:
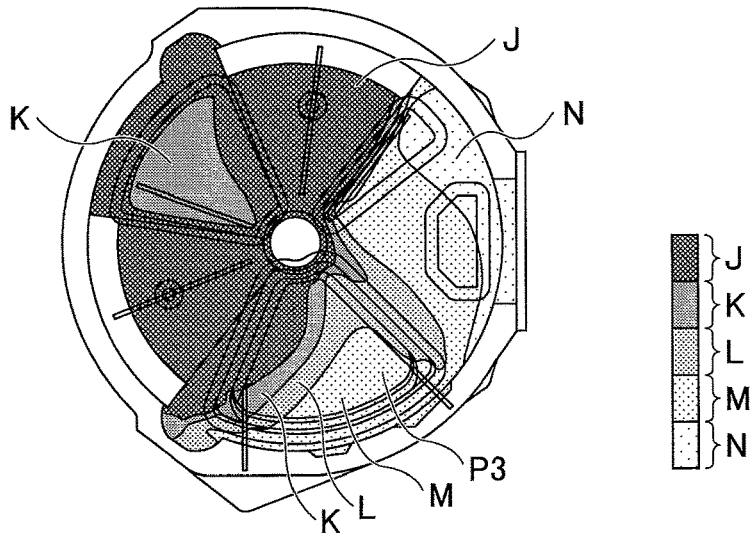
FIG. 17C is a diagram showing a concentration distribution of Ar gas above a turntable in the second simulation.

FIGS. 17A through 17C are diagrams showing a second simulation result of the plasma processing method and plasma processing apparatus according to an embodiment of the present invention. FIG. 17A is a diagram for showing a positional relationship of the plasma processing apparatus according to the embodiment of the present invention. As shown in FIG. 17A, the following simulation results are shown when the plasma processing area P3 is arranged at a lower position in the drawing, at a position of 6 o'clock.

With respect to process conditions, the pressure in the vacuum chamber 1 is 2 Torr; the temperature of the wafer W is 400 degrees C.; and the rotational speed of the turntable 2 is 20 rpm. The flow rate of Ar gas from the separation gas supply pipe 51 is 1 slm, and the flow rate of Ar gas from the separation gas nozzles 41 and 42 are 5 slm, respectively. With respect to the source gas, the first process gas nozzle 31 supplies an organic aminosilane gas at a flow rate of 300 slm, with Ar gas that is used as a carrier gas at a flow rate of 1 slm. With respect to the reaction gas, the second process gas nozzle 32 supplies oxygen gas at a flow rate of 6 slm. With respect to the plasma processing area P3, the base nozzle 33 supplies a mixed gas of Ar/He/O$_2$ at flow rates of 5 sim/5 slm/50 sccm. The outer nozzle 34 supplies a mixed gas of He/O$_2$ at flow rates of 5 slm/25 sccm. The axis-side nozzle 35 supplies a mixed gas of Ar/O$_2$ at flow rates of 5 slm/25 sccm.

In the second simulation experiment, the flow rate of He is set higher than that of the first simulation experiment as a whole. In particular, the outer nozzle 34 supplies a mixed gas consisting of He and O$_2$ without containing Ar.

The simulation experiment is performed under the conditions, and a concentration distribution of He above the turntable 2 and a concentration distribution of Ar gas above the turntable 2 is calculated. The concentration level of each gas is indicated by a level J, a level K, a level L, a level M and a level N in descending order of concentration.

FIG. 17B is a diagram showing a concentration distribution of He gas above the turntable 2. As shown in FIG. 17B, the level K is present at peripheral area of the plasma processing area P3, and the level L and the level M are present around the level K while decreasing the concentration level with the decreasing distance from the level K area. The other area indicates the level L that has the lowest concentration level.

FIG. 17C is a diagram showing a concentration of Ar gas above the turntable 2. As shown in FIG. 17C, areas of the levels J and K that have high concentration levels are present on the central axis side in the plasma processing area P3, but the other area in the plasma processing area P3 indicates the levels L and M with the low concentration levels. The separation area D in which the separation gas is supplied indicates the highest level J, and the first process area P1 indicates the level K that has slightly lower concentration level than the level J.

As shown in FIGS. 17B and 17C, in the plasma processing area P3, the concentration of He is high in the area where the outer nozzle 34 supplying He gas is present, and the concentration of Ar is high in the area where the axis-nozzle 35 supplying Ar gas is present, which makes it possible to separately supply each noble gas with different ionization energy and radical energy to each area on purpose by using the regional plasma processing gas nozzles 33 through 35. Moreover, the concentration of He is higher than that of the first simulation result, which indicates that the concentrations of He and Ar can be slightly adjusted by adjusting the flow ratio. In other words, an optimal flow ration can be set depending on the process.

Figure 18A:
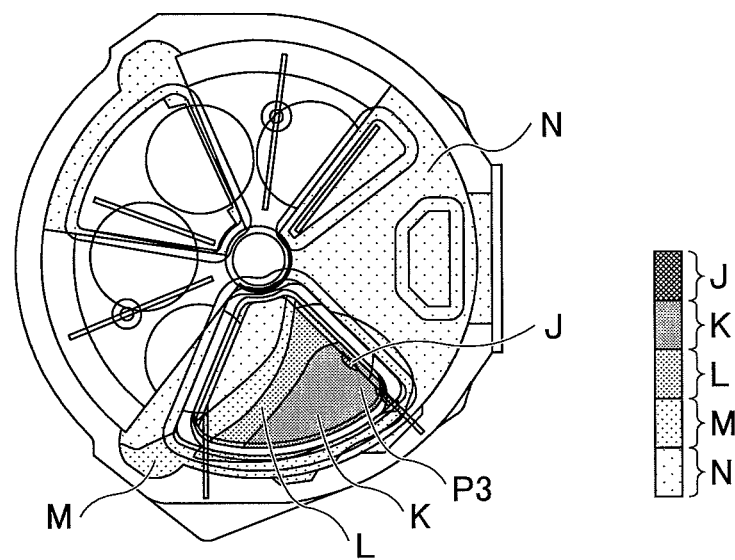
FIG. 18A is a diagram showing a concentration distribution of He gas of an area under an opening of a plasma processing area in the second simulation.
Figure 18B:
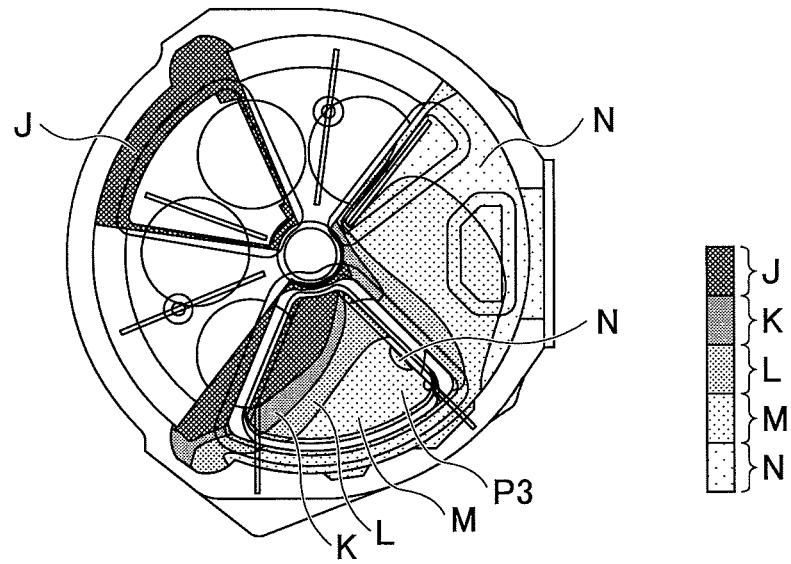
FIG. 18B is a diagram showing a concentration distribution of Ar gas of an area under an opening of a plasma processing area in the second simulation.

FIGS. 18A and 18B are diagrams showing second simulation results of the plasma processing method and plasma processing apparatus according to an embodiment of the present invention in a different area from that of FIG. 17.

FIG. 18A is a diagram showing a concentration distribution of He gas below the opening 11a of the plasma processing area P3. As shown in FIG. 18A, with respect to He, the level K area is present with the high level concentration in an outer area near the outer nozzle 34 in the plasma processing area P3, and the levels L and M areas are present around the level K area with a lower concentration than the level K area. The other area indicates the level N that has the lowest concentration level.

FIG. 18B is a diagram showing a concentration distribution of Ar gas below the opening 11a of the plasma processing area P3. As shown in FIG. 18B, the levels J and K with the high concentrations are present in an area on the central axis side in the plasma processing area P3, but the other area in the plasma processing area P3 indicates the levels L and M with the middle and low concentration levels.

As shown in FIGS. 18A and 18B, in the plasma processing area P3, the concentration of He is high in the area where the outer nozzle 34 supplying He gas is present, and the concentration of Ar is high in the area where the axis-nozzle 35 supplying Ar gas is present, which makes it possible to separately supply each noble gas with different ionization energy and radical energy to each area on purpose by using the regional plasma processing gas nozzles 33 through 35. Thus, it is possible to increase the quantity of plasma processing in the peripheral area of the turntable 2 and to decrease the quantity of plasma processing in the area on the central axis side, thereby canceling and correcting the influence of angular velocity.

Even in FIGS. 18A and 18B, the concentration of He is higher than that of the first simulation result, which indicates that the concentration can be adjusted by adjusting the flow ratio.

In this manner, from FIGS. 17B and 17C, and FIGS. 18A and 18B, even above the turntable 2 or below the opening 11a, the plasma processing gas can be supplied so that the concentration of He gas is high on the peripheral side of the turntable 2 and that the concentration of Ar gas is high on the central axis side of the turntable 2, thereby correcting the difference in angular velocity between the peripheral side and the central axis side and improving the uniformity across the surface of the wafer W of the plasma processing.

Moreover, the first and second simulation results of FIGS. 17B, 17C, 18A ns 18B indicates that the plasma processing gas can be supplied so that the concentration of He gas is high on the peripheral side of the turntable 2 and that the concentration of Ar gas is high on the central axis side even above the turntable 2 or below the opening 11a, thereby correcting the difference in angular velocity between the peripheral side and the central axis side and improving the uniformity of plasma processing across the surface of the wafer W.

Furthermore, the first and second simulation results shown in FIGS. 15A through 18B indicates that the concentration adjustment of He and Ar can be slightly adjusted by setting the flow ratio (mixing ratio) of He gas to Ar gas and that the flow rate setting appropriate for the process can be performed.

Thus, according to the plasma processing method and plasma processing apparatus of the embodiments of the present invention, quantity of plasma processing can be controlled for multiple areas, and uniformity of plasma processing including a modification process across a surface of a substrate can be improved while an appropriate plasma process can be performed in response to a variety of processes.

In other words, controllability of the plasma process can be improved according to the plasma processing method and plasma processing apparatus according to the embodiments of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A plasma processing method, comprising steps of:
supplying a plurality of types of mixed gases to a plurality of areas on a film deposited on surfaces of a plurality of substrates placed on a turntable, the plurality of areas being provided depending on a distance from a center of the turntable, the plurality of areas including a first area and a second area, the second area being farther from the center of the turntable than the first area, at least one of the plurality of types of mixed gases containing a plurality of noble gases, the plurality of noble gasses containing a first noble gas having first ionization energy and a second noble gas having second ionization energy higher than the first ionization energy of the first noble gas, the plurality of types of mixed gases having different mix proportions of the plurality of noble gases from each other, the plurality of types of mixed gases including a first mixed gas supplied to the first area and a second mixed gas supplied to the second area, the second mixed gas containing the second noble gas at a proportion higher than that of the first mixed gas;
converting the plurality of types of mixed gases to plasma using a single plasma antenna; and
performing a plasma process by using the mixed gases converted to the plasma on the film under the single plasma antenna.

2. The plasma processing method as claimed in claim 1, wherein the plasma process is performed in a process chamber, and
wherein a film deposition process is performed in the process chamber.

3. The plasma processing method as claimed in claim 2, wherein the plurality of substrates is placed in a radius along a circumferential direction of the turntable, and
wherein the first area is located on a central side of the turntable, the second area is located on a peripheral side of the turntable, and a third area is provided extending from the peripheral area to the central area along a radial direction of the turntable.

4. The plasma processing method as claimed in claim 3, wherein a regional gas supply unit is provided in each of the central area, the peripheral area and the main area, and each of the mixed gases is supplied from the gas supply unit.

5. The plasma processing method as claimed in claim 3, wherein the first mixed gas is supplied to the first area, and the second mixed gas is supplied to the third area and the second area.

6. The plasma processing method as claimed in claim 3, wherein the first mixed gas is supplied to the central area,
wherein the second mixed gas is supplied to the main area, and
wherein a third mixed gas is supplied to the peripheral area.

7. The plasma processing method as claimed in claim 6, wherein the film deposition process includes steps of:
supplying a source gas to the substrates, and
supplying a reaction gas capable of producing a reaction product by reacting with the source gas.

8. The plasma processing method as claimed in claim 7, wherein a source gas supply area for supplying the source gas to the substrates, a reaction gas supply area for supplying the reaction gas to the substrates, and a plasma processing area for performing the plasma process on the film are provided above the turntable and along the circumferential direction, and
the steps of supplying the source gas to the substrates, supplying the reaction gas to the substrates and performing the plasma process on the film are performed by rotating the turntable a plurality of times to cause the substrates to pass through the source gas supply area, the reaction gas supply area and the plasma processing area the plurality of times.

9. The plasma processing method as claimed in claim 8, wherein purge gas supply areas for supplying a purge gas to the substrates are provided above the turntable and between the source gas supply area and the reaction gas supply area, and between the plasma processing area and the source gas supply area, and
wherein a step of supplying a purge gas to the substrate is provided between the steps of supplying the source gas to the substrates and supplying the reaction gas to the substrates, and between the steps of performing the plasma process on the film and supplying the source gas to the substrates.

10. The plasma processing method as claimed in claim 1, wherein the first noble gas is argon gas,
wherein the second noble gas is helium gas, and
wherein each of the first mixed gas and the second mixed gas contains oxygen gas.

11. The plasma processing method as claimed in claim 7, wherein the source gas is a silicon-containing gas, and the reaction gas is an oxidation gas.

12. A plasma processing method, comprising steps of:
supplying a plurality of types of mixed gases to a plurality of areas on a film deposited on surfaces of a plurality of substrates placed on a turntable, the plurality of areas being provided depending on a distance from a center of the turntable, the plurality of areas including a first area and a second area, the second area being farther from the center of the turntable than the first area, the plurality of types of mixed gases containing a plurality of noble gases, the plurality of noble gasses containing a first noble gas having first ionization energy and a second noble gas having second ionization energy higher than the first ionization energy of the first noble gas, the plurality of types of mixed gases having different mix proportions of the plurality of noble gases from each other, the plurality of types of mixed gases including a first mixed gas supplied to the first area and a second mixed gas supplied to the second area, the second mixed gas containing the second noble gas at a proportion higher than that of the first mixed gas, the plurality of types of mixed gases being supplied to the plurality of areas by way of different passages horizontally extending while bending;

converting the plurality of types of mixed gases to plasma using a single plasma antenna; and performing a plasma process by using the mixed gases converted to the plasma on the film under the single plasma antenna.

* * * * *